(12) United States Patent
Lai et al.

(10) Patent No.: US 9,123,778 B2
(45) Date of Patent: Sep. 1, 2015

(54) DAMASCENE CONDUCTOR FOR 3D ARRAY

(71) Applicant: MACRONIX INTERNATIONAL CO., LTD., Hsinchu (TW)

(72) Inventors: Erh-Kun Lai, Elmsford, NY (US); Yen-Hao Shih, Elmsford, NY (US); Guanru Lee, Kaohsiung (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 13/897,702

(22) Filed: May 20, 2013

(65) Prior Publication Data
US 2014/0264546 A1 Sep. 18, 2014

Related U.S. Application Data

(60) Provisional application No. 61/778,477, filed on Mar. 13, 2013.

(51) Int. Cl.
*H01L 21/4763* (2006.01)
*H01L 21/8242* (2006.01)
(Continued)

(52) U.S. Cl.
CPC .... *H01L 21/76808* (2013.01); *H01L 21/28282* (2013.01); *H01L 21/7682* (2013.01);
(Continued)

(58) Field of Classification Search
CPC .......... H01L 21/76808; H01L 21/76829; H01L 21/7682; H01L 21/28282; H01L 29/408; H01L 29/4234; H01L 29/42344; H01L 29/42348; H01L 29/42352; H01L 29/4238; H01L 29/11551; H01L 29/7881; H01L 29/792; H01L 29/66825; H01L 29/66833; H01L 27/0207; H01L 27/0688; H01L 27/105; H01L 27/11551; H01L 27/11556; H01L 27/11563; H01L 27/11578; H01L 27/11524; H01L 27/11582; H01L 45/06; H01L 45/085; H01L 45/1233; H01L 45/126; H01L 45/1266; H01L 45/146; H01L 45/147; H01L 23/528
USPC ....... 438/623, 591, 261, 142, 128, FOR. 426; 257/774, 324, 314, 261, 292, E27.081, 257/2–5, 246, 248, E45.002, E29.303, 257/E29.304, E29.309, E29.3, E21.18, 257/E21.21, 409, E21.423, E21.679; 365/63, 148, 185.17, 230.06, 96, 174, 365/130
See application file for complete search history.

(56) References Cited

U.S. PATENT DOCUMENTS 6,475,847 B1 * 11/2002 Ngo et al. .................... 438/201
6,531,359 B1 3/2003 Tempel et al.
(Continued)

FOREIGN PATENT DOCUMENTS

KR 20010056888 A 7/2001
KR 20050011203 A 1/2005

OTHER PUBLICATIONS

Wang H-H et al., "A New Read-Distrub Failure Mechanism Caused by Boosting Hot-Carrier Injection Effect in MLC NAND Flash Memory," IEEE Int'l Memory Workshop, 2009, pp. 1-2.
(Continued)

*Primary Examiner* — Julio J Maldonado
*Assistant Examiner* — Moazzam Hossain
(74) *Attorney, Agent, or Firm* — Yiding Wu; Haynes Beffel & Wolfeld LLP

(57) ABSTRACT

For certain three dimensionally stacked memory devices, bit lines or word lines for memory cells are stacked in spaced apart ridge like structures arranged to extend in a first direction. In such structures, complementary wordlines or bit lines, can be damascene features between the spaced apart. The damascene conductors can be formed using double patterned masks to etch sub-lithographic sacrificial lines, forming a fill over the sacrificial lines, and then removing the sacrificial lines to leave trenches that act as the damascene molds in the fill. Then the trenches are filled with the conductor material. The 3D memory array can include dielectric charge trapping memory cells, which have a high-K blocking dielectric layer, and in which the conductor material comprises a high work function material.

13 Claims, 27 Drawing Sheets

(51) Int. Cl.
*H01L 29/40* (2006.01)
*H01L 21/768* (2006.01)
*H01L 21/28* (2006.01)
*H01L 29/423* (2006.01)
*H01L 27/115* (2006.01)
*H01L 29/51* (2006.01)
*H01L 29/66* (2006.01)
*H01L 29/792* (2006.01)

(52) U.S. Cl.
CPC .... *H01L21/76829* (2013.01); *H01L 27/11568* (2013.01); *H01L 27/11578* (2013.01); *H01L 29/4234* (2013.01); *H01L 29/513* (2013.01); *H01L 29/66833* (2013.01); *H01L 29/792* (2013.01)

(56) References Cited

U.S. PATENT DOCUMENTS

| | | |
|---|---|---|
| 6,906,940 B1 | 6/2005 | Lue |
| 7,005,350 B2 | 2/2006 | Walker et al. |
| 7,459,715 B2 * | 12/2008 | Toda et al. ............... 257/2 |
| 7,995,371 B2 * | 8/2011 | Rinerson et al. ........ 365/148 |
| 8,199,576 B2 | 6/2012 | Fasoli et al. |
| 8,488,387 B2 | 7/2013 | Lue et al. |
| 8,503,213 B2 | 8/2013 | Chen et al. |
| 8,605,495 B2 | 12/2013 | Lung |
| 2007/0253233 A1 | 11/2007 | Mueller et al. |
| 2008/0106931 A1 | 5/2008 | Toda |
| 2008/0285350 A1 | 11/2008 | Yeh |
| 2009/0166723 A1 | 7/2009 | Sung et al. |
| 2009/0278193 A1 * | 11/2009 | Murata et al. ............. 257/324 |
| 2010/0226195 A1 * | 9/2010 | Lue ............... 365/230.06 |
| 2010/0270593 A1 | 10/2010 | Lung et al. |
| 2010/0322000 A1 * | 12/2010 | Shim et al. ............ 365/185.03 |
| 2011/0095353 A1 | 4/2011 | Lue |
| 2011/0149656 A1 | 6/2011 | Tang et al. |
| 2011/0216604 A1 * | 9/2011 | Mikajiri et al. ......... 365/185.26 |
| 2012/0007167 A1 | 1/2012 | Hung et al. |
| 2012/0051137 A1 | 3/2012 | Hung et al. |
| 2012/0146126 A1 | 6/2012 | Lai et al. |
| 2012/0168849 A1 | 7/2012 | Choi et al. |
| 2012/0181580 A1 | 7/2012 | Lue et al. |
| 2012/0181599 A1 | 7/2012 | Lung |
| 2012/0181654 A1 | 7/2012 | Lue |
| 2012/0181684 A1 | 7/2012 | Lue et al. |
| 2012/0182801 A1 | 7/2012 | Lue |
| 2012/0182802 A1 | 7/2012 | Hung et al. |
| 2012/0182806 A1 | 7/2012 | Chen et al. |
| 2012/0182807 A1 | 7/2012 | Lue |
| 2012/0235224 A1 | 9/2012 | Yeh |
| 2012/0236642 A1 | 9/2012 | Lue |
| 2012/0261788 A1 | 10/2012 | Lin et al. |
| 2012/0281478 A1 | 11/2012 | Lue et al. |
| 2012/0327714 A1 | 12/2012 | Lue |
| 2012/0327719 A1 | 12/2012 | Lue |
| 2013/0003434 A1 | 1/2013 | Lue et al. |
| 2013/0023115 A1 * | 1/2013 | Fan et al. ............ 438/586 |
| 2013/0175598 A1 | 7/2013 | Chen et al. |
| 2013/0277799 A1 | 10/2013 | Chen et al. |

OTHER PUBLICATIONS

Wen, Huang-Chun, et al., "Issues associated with p-type band-edge effective work function metal electrodes: Fermi-level pinning and flatband roll-off," Int'l Sympon VLSI Technology, Systems and Applications, Apr. 23-25, 2007, pp. 1-2.
White et al., "On the Go with SONOS" IEEE Circuits and Devices, Jul. 2000, 22-31.
Wicker, Guy et al., Nonvolatile, High Density, High Performance Phase Change Memory, 1999, http://klabs.org/richcontent/MAPLDCon99/Papers/P21_Tyson_P.PDF#search='nonvolatile%20high%20density%20high%20performance%20phase%20change%20memory', 8pages.
Wicker, Guy, "A Comprehensive Model of Submicron Chalcogenide Switching Devices," Doctoral Dissertation, Wayne State University, Detroit, MI 1996, 137 pp.
Wolf, Stanley, Excerpt from: Silicon Processing for the VLSI Era-vol. 4, pp. 674-679, 2004.
Wu Q et al., "A First Study on Self-Healing Solid-State Drives," IEEE Int'l Memory Workshop (IMW), May 2011, 4pp.
Wu, W.-C., et al., "Highly Reliable Multilevel and 2-bit/cell Operation of Wrapped Select Gate (WSG) SONOS Memory," IEEE Electron Device Letters, vol. 28, Issue 3, Mar 2007, 214-216.
Wuttig, Matthias, "Towards a Universal Memory?" Nature Materials, Apr. 2005, pp. 265-266, vol. 4.
Xie P. et al., "Analysis of Higher-Order Pitch Division for Sub-32nm Lithography," Optical Microlithography XXII, Proc. SPIE vol. 7274, Mar. 2009, 8 pp.
Yamada et al., "A self-convergence erasing scheme for a simple stacked gate flash EEPROM," Proc. Int'l. Electron Devices Meeting, Dec. 1991 307-310.
Yamada, Noboru, "Potential of Ge—Sb—Te phase-change optical disks for high-data-rate recording in the near future," (Conference Proceedings Paper), Jul. 30, 1997, vol. 3109, 10 pages.
Yeh, C.C., et al., "PHINES: A Novel Low Power Program/Erase, Small Pitch, 2-Bit per Cell Flash Memory," Electron Devices Meeting, 2002. IEDM '02. Digest. International , Dec. 8-11, 2002, pp. 931-934.
Yi, J. H. et al., "Novel Cell Structure of PRAM with Thin Metal Layer Inserted GeSbTe," IEEE IEDM Dec. 10, 2003, 4 pages.
Yonehara, T. et al., "Control of Grain Boundary Location by Selective Nucleation Over Amorphous Substrates, " Mat. Res. Soc. Symp. Proc., vol. 106, 1998, pp. 21-26.
Yoon D.H. et al. "FREE-p: Protecting Non-volatile Memory against both Hard and Soft Errors," Proc. of the IEEE HPCA, pp. 466-477, 2011.
Yun et al, "Stacked-nanowire device with virtual source/drain (SD-VSD) for 3D NAND flash memory application," Solid-State Electronics, vol. 64, pp. 42-46 (Jul. 26, 2011).
Yun et al., "Single-Crystalline Si STacked ARray (STAR)," IEEE Trans. Electron. Devices, vol. 58, pp. 1006-1014 (Apr. 2011).
Zhang W. et al., "Exploring Phase Change Memory and 3D Die-Stacking for Power/Thermal Friendly, Fast and Durable Memory Architectures," Proc. of the IEEE PACT, pp. 101-112, 2009.
Zhou P. et al., "A durable and Energy Efficient Main Memory Using Phase Change Memory Technology," Proc. 36th Annual Int'l Symp. on Computer Architecture (ISCA '09), Jun. 2009, Austin, TX, pp. 14-23.
Haring Bolivar, P. et al., "Lateral Design for Phase Change Random Access Memory Cells with Low-Current Consumption," presented at 3rd E*PCOS 04 Symposium in Balzers, Principality of Liechtenstein, Sep. 4-7, 2004, 4pp.
Hijiya, S., et al., "High-Speed Write/Erase EAROM Cell with Graded Energy Band-Gap Insulator," Electronics and Communications in Japan, Part 2, vol. 68, No. 2, Jun. 6, 1984, 28-36.
Hinkle, C.L., et al., "Enhanced tunneling in stacked gate dielectrics with ultra-thin HfO2 (ZrO2) layers sandwiched between thicker SiO2 layers," Surface Science, Sep. 20, 2004, vol. 566-568, 1185-1189.
Horii, H. et al., "A Novel Cell Technology Using N-doped GeSbTe Films for Phase Change RAM," Jun. 10-12, 2003 Symposium on VLSI Technology Digest of Technical Papers, pp. 177-178.
Hsu et al., "Study of Sub-30nm Thin Film Transistor (TFT) Charge-Trapping (CT) Devices for 3D NAND Flash Application," 2009 IEEE, Dec. 7-9, 2009, pp. 27.4.1-27.4.4.
Hu J. et al., "Reducing Write Activities on Non-volatile Memories in Embedded CMPs via Data Migration and Recomputation," Proc. of the IEEE/ACM DAC, pp. 350-355, 2010. Jun. 13-18, 2010.
Huai, Yiming, "Spin-Transfer Torque MRAM (STT-MRAM): Challenges and Prospects," AAPPS Bulletin, vol. 18, No. 6, Dec. 2008, pp. 33-40.
Hubert et al., "A Stacked SONOS Technology, Up to 4 Levels and 6nm Crystalline Nanowires, With Gate-All-Around or Independent Gates (Flash), Suitable for Full 3D Integration," IEEE 2009, Dec. 7-9, 2009, pp. 27.6.1-27.6.4.

(56) References Cited

OTHER PUBLICATIONS

Hudgens, S. et al., "Overview of Phase-Change Chalcogenide Nonvolatile Memory Technology," MRS Bulletin, Nov. 2004, pp. 829-832.

Hwang, Y. N. et al., "Full Integration and Reliability Evaluation of Phase-change RAM Based on 0.24um-CMOS Technologies," Jun. 10-12, 2003 Symposium on VLSI Technology Digest of Technical Papers, pp. 173-174.

Ito, et al., "A Novel MNOS Technology Using Gate Hole Injection in Erase Operation for Embedded Nonvolatile Memory Applications." 2004 Symp. on VLSI Tech Dig. Of Papers 2004, 80-81, Jun. 15-17, 2004.

Iwasaki, Hiroko et al., "Completely Erasable Phase Change Optical Disk," Jpn. J. Appl. Phys., Feb. 1992, pp. 461-465, vol. 31.

Jang et al., "Vertical Cell Array Using TCAT (Terabit Cell Array Transistor) Technology for Ultra High Density NAND Flash Memory," 2009 Symposium on VLSI Technology Digest of Technical Papers, Jun. 16-18, 2009, pp. 192-193.

Jeong, C. W. et al., "Switching Current Scaling and Reliability Evaluation in PRAM," IEEE Non-Volatile Semiconductor Memory Workshop, Monterey, CA 2004, pp. 28-29 and workshop cover sheet.

Jeong, Min-Kyu, et al., "Gate Work Function and Contact Engineering in Nanoscale Vertical Pillar Transistor for DRAM Cell Transistors," Kyoto, Japan, Nov. 5-8, 2007, pp. 112-113.

Jiang L. et al., "Cooperative Integration of Wear-Leveling and Salvaging for PCM Main Memory," Proc. of the IEEE/IFIP DSN, pp. 221-232, 2011.

Johnson, Mark, et al., "512-Mb PROM With a Three-Dimensional Array of Diode/Antifuse Memory Cells," IEEE Journal of Solid-State Circuits, vol. 38, No. 11, Nov. 2003, 9 pages.

Jung, Soon-Moon, et al., "Three Dimensionally Stacked NAND Flash Memory Technology Using Stacking Single Crystal Si Layers on ILD and TANOS Structure for Beyond 30nm Node," IEEE IEDM 2006, Dec. 11-13, 2006, pp. 1-4.

Katsumata et al., "Pipe-shaped BiCS Flash Memory With 16 Stacked Layers and Multi-Level-Cell Operation for Ultra High Density Storage Devices," 2009 Symposium on VLSI Technology Digest of Technical Papers, Jun. 16-18, 2009, pp. 136-137.

Kau Dc, et al., "A stackable cross point phase change memory," 2009 International Electron Devices Meeting, Baltimore MD, pp. 27.1.1-27.1.4.

Kim et al., "Multi-Layered Vertical Gate NAND Flash Overcoming Stacking Limit for Terabit Density Storage," 2009 Symposium on VLSI Technology Digest of Technical Papers, Jun. 16-18, 2009, pp. 188-189.

Kim et al., "Novel 3-D Structure for Ultra High Density Flash Memory with VRAT (Vertical-Recess-Array-Transistor) and PIPE (Planarized Integration on the same PlanE)," IEEE 2008 Symposium on VLSI Technology Digest of Technical Papers, Jun. 17-19, 2008, pp. 122-123.

Kim et al., "Robust Multi-Bit Programmable Flash Memory Using a Resonant Tunnel Barrier," Electron Dev. Mtg. Dec. 5-7, 2005, IEDM Technical Digest 861-864.

Kim, et al., Novel Vertical-Stacked-Array-Transistor (VSAT) for ultra-high-density and cost-effective NAND Flash memory devices and SSD (Solid State Drive), 2009 Symposium on VLSI Technology Digest of Technical Papers, Jun. 16-18, 2009, pp. 186-187.

Kim, Kinam et al., "Reliability Investigations for Manufacturable High Density PRAM," IEEE 43rd Annual International Reliability Physics Symposium, San Jose, Apr. 17-21, 2005, pp. 157-162.

Kim, Moon Kyung, et al., "The Effects of ONO thickness on Memory Characteristics in Nano-scale Charge Trapping Devices," Int'l Symp on VLIS Technology, Systems and Applications, Apr. 23-25, 2007, pp. 1-2.

Kinoshita, A, et al., "High-Performance 50-nm-Gate-Length Schottky-Source/Drain MOSFETs with Dopant-Segregation Junctions," IEEE Symp. on VLSI Technology Digest of Papers, Jun. 14-16, 2005, pp. 158-159.

Kinoshita, A, et al., "Solution for High-Performance Schottky-Source/Drain MOSFETs: Schottky Barrier Height Engineering with Dopant Segregation Technique," IEEE Symp. on VLSI Technology Digest of Papers, Jun. 15-17, 2004, pp. 168-169.

Kojima, Rie et al., "Ge—Sn—Sb—Te Phase-change Recording Material Having High Crystallization Speed," Proceedings of PCOS 2000, pp. 36-41.

Lacita, A. L., "Electrothermal and Phase-change Dynamics in Chalcogenide-based Memories," IEEE IEDM Dec. 13-15, 2004, 4 pp.

Lai et al., "A Multi-Layer Stackable Thin-Film Transistor (TFT) NAND-Type Flash Memory," Electron Devices Meeting, 2006, IEDM '06 International, Dec. 11-13, 2006, pp. 1-4.

Lai et al., "Highly Reliable MA BE-SONOS (Metal-A12 03 Bandgap Engineered SONOS) Using a SiO2 Buffer Layer" VLSI Technology, Systems and Applications, 2008, VLSI-TSA 2008 International Symposium on Apr. 21-23, 2008, pp. 58-59.

Lai, Erh-Kun, et al., "A Multi-Layer Stackable Thin-Film Transistor (TFT) NAND-Type Flash Memory," IEEE IEDM 2006, Dec. 11-13, 2006, pp. 1-4.

Lai, et al., "Damascene Conductor for 3D Array," U.S. Appl. No. 13/897,702, filed on May 20, 2013, 56 pages.

Lai, Sheng-Chih, et al., "A Study on the Erase and Retention Mechanisms for MONOS, MANOS, and BE-SONOS Non-Volatile Memory Devices," Int'l Symp on VLSI Technology, Systems and Applications, Apr. 23-25, 2007, pp. 1-2.

Lai, Stefan, "Current Status of the Phase Change Memory and Its Future," IEEE IEDM Dec. 10, 2003, pp. 255-258.

Lai, Stephan et al., "OUM-A 180 nm Nonvolatile Memory Cell Element Technology for Stand Alone and Embedded Applications," IEEE IEDM Dec. 2-5, 2001, pp. 803-806.

Lee B.C. et al., Architecting Phase Change Memory as a Scalable DRAM Alternative, Proc. 36th Annual Int'l Symp. on Computer Architecture (ISCA '09), Austin, TX, Jun. 2009, pp. 2-13.

Lee J-D et al., "Effects of Interface Trap Generation and Annihilation on the Data Retention Characteristics of Flash Memory Cells," IEEE Trans. on Device and Materials Reliability, vol. 4, No. 1, Mar. 2004, pp. 110-117.

Lee, Chang, et al., "A Novel SONOS Structure of SiO2/SiN/Al2O3 with TaN Metal Gate for Multi-Giga Bit Flash Memeries," IEEE 2003, 4 pages, Dec. 8-10, 2003.

Lee, Chungho, et al., "Operational and Reliability Comparison of Discrete-Storage Nonvolatile Memories: Advantages of Single-and Double-Layer Metal Nanocrystals," IEEE IEDM 03-557, 22.6.1-22.6.4, Dec. 8-10, 2003.

Li F., et al., "Evaluation of SiO2 Antifuse ina 3D-OTP Memory," IEEE Transaction on Device and Materials Reliability, vol. 4, No. 3, 2004, pp. 416-421.

Likharev, "Layered Tunnel Barriers for Nonvolatile Memory Devices, "Appl. Phys. Lett. 73(15) Oct. 1998 2137-2139.

Lue et al., "A BE-SONOS (Bandgap Engineered SONOS) NAND for Post-Floating Gate Era Flash Memory," Int'l Symp on VLSI Tech, Apr. 23-25, 2007, 2 pages.

Lue et al., "A Novel Buried-Channel FinFET BE-SONOS NAND Flash With Improved Memory Window and Cycling Endurance," 2009 Symposium on VLSI Technology Digest of Technical Papers, Jun. 16-18, 2009, pp. 224-225.

Lue et al., "A Novel P-Channel NAND-Type Flash memory with 2-bit/cell Operation and High Programming Throughput (>20 MB/sec)," IEEE 2005, 4 pages.

Lue, Hang-Ting et al., Scaling Evaluation of BE-SONOS NAND Flash Beyond 20 nm, 2008 Symposium on VLSI technology, Digest of Papers, Jun. 2008, 116-117.

Lue, Hang-Ting, et al, BE-SONOS: A Bandgap engineered SONOS with excellent performance and reliability, Electron Devices Meeting, 2005 IEDM Technical Digest, IEEE International, Dec. 5-7, 2005 pp. 547-550.

Maeda, S, et al. "A Vertical F-Shape Transistor (VFT) Cell for 1Gbit DRAM and Beyond," 1994 Symposium on VLSI Technology, Digest of Technical Papers. Jun. 7-9, 1994 pp. 133-134.

(56) References Cited

OTHER PUBLICATIONS

Mielke N. et al., "Flash EEPROM Threshold Instabilities due to Charge Trapping During Program/Erase Cycling," IEEE Trans. on Device and Materials Reliability, vol. 4, No. 3, Sep. 2004, pp. 335-344.

Minami, et al., "New Scaling Guidelines for MNOS Nonvolatile Memory Devices," IEEE Trans on Electron Devices 38 (11) Nov. 1991 2519-2526.

Mott, Nevill, "Electrons in Glass," Nobel Lecture, Dec. 8, 1977, Physics, 1977, pp. 403-413.

Office Action mailed Oct. 19, 2007 in U.S. Appl. No. 11/324,495.

Oh, Hyung-Rok, et al., "Enhanced Write Performance of a 64Mb Phase-Change Random Access Memory," ISSCC 2005, Session 2, Non-Volatile Memory, 2.3, 3 pages.

Ovonyx Non-Confidential paper entitled "Ovonic Unified Memory," Dec. 1999, pp. 1-80.

Ovshinsky, Sandford R., "Reversible Electrical Switching Phenomena in Disordered Structures," Physical Review Letters, vol. 21, No. 20, Nov. 11, 1968, pp. 1450-1453.

Owen, Alan E. et al., "Electronic Conduction and Switching in Chalcogenide Glasses," IEEE Transactions on Electron Devices, vol. Ed. 20, No. 2, Feb. 1973, pp. 105-122.

Padilla, Alvaro, et al., "Dual-Bit SONOS FinFET Non-Volatile Memory Cell and New Method of Charge Detection," Int'l Symp on VLSI Technology, Systems and Applications, Apr. 23-25, 2007, pp. 1-2.

Paul et al., "Impact of a Process Variation on Nanowire and Nanotube Device Performance", IEEE Transactions on Electron Devices, vol. 54, No. 9, Sep. 2007, p. 2369-2376.

Pellizer, F. et al.,"Novel u Trench Phase—Change Memory Cell for Embedded and Stand-Alone Non-Volatile Memory Applications," Jun. 15-17, 2004 Symposium on VLSI Technology Digest of Technical Papers, pp. 18-19.

Pirovano, Agostino et al.,"Reliability Study of Phase-Change Nonvolatile Memories," IEEE Transactions on Device and Materials Reliability, Sep. 2004, pp. 422-427, vol. 4, No. 3.

Prakash, S. et al., "A guideline for Designing Chalcogenide-Based Glasses for Threshold Switching Characteristics," IEEE Electron Device Letters, vol. 18, No. 2, Feb. 1997, pp. 45-47.

Qureshi M. et al., "Practical and Secure PCM Systems by Online Detection of Malicious Write Streams," Proc. of the IEEE HPCA, pp. 478-489, 2011.

Qureshi M.K. et al. "Improving Read Performance of Phase Change Memories via Write Cancellation and Write Pausing," IEEE 16th Int'l Symp. High Performance Computer Architecture (HPCA), Bangalore, Jan. 2010, pp. 1-11.

Qureshi M.K. et al., "Enhancing Lifetime and Security of PCM-Based Main Memory with Start-Gap Wear Leveling," Proc. 42nd Annual IEEE/ACM Int'l Symp. on Microarchitecture (MICRO '09) New York, NY, Dec. 2009, pp. 14-23.

Qureshi M.K. et al., "Scalable High Performance Main Memory System Using Phase-Change Memory Technology," Proc. 36th Annual Int'l Symp. on Computer Architecture (ISCA '09), Jun. 2009, Austin, TX, pp. 24-33.

Radaelli, A. et al., "Electronic Switching Effect and Phase-Change Transition in Chalcogenide Materials," IEEE Electron Device Letters, Oct. 2004, pp. 684-686, vol. 25, No. 10.

Risch, Lothar, et al., "Recent Progress with Vertical Transistors," Solid-State Device Research Conference, 1997. Proceeding of the 27th European Sep. 22-24, 1997 pp. 34-41.

Rochefort, C. et al., "Manufacturing of High Aspect-Ration p-n Junctions Using Vapor Phase Doping for Application in Multi-Resurf Devices," IEEE Jun. 4-7, 2002, pp. 237-240.

Sasago Y., et al., "Cross-point phase change memory with 4F2 cell size driven by low-contact-resistivity poly-Si diode," 2009 Symposium on VLSI Technology Digest of Tech. Papers, pp. 24-25, Jun. 16-18, 2009.

Schafft, Harry A. et al., "Thermal Conductivity Measurements of Thin Films Silicon Dioxide," Proceedings of the IEEE 1989 International Conference on Microelectronic Test Structures vol. 2, No. 1, Mar. 1989, pp. 121-124.

Schechter S. et al., "Use ECP, not ECC, for Hard Failures in Resistive Memories," Proc. 37th Annual Int'l Symp. on Computer Architecture (ISCA '10) Saint-Malo, France, Jun. 2010, 12 pp.

Seong N. H. et al., "Security Refresh: Prevent Malicious Wear-Out and Increase Durability for Phase-Change Memory with Dynamically Randomized Address Mapping," Proc. of the IEEE/ACM ISCA, pp. 383-394, 2010.

Shih et al., "A Novel 2-bit/cell Nitride Storage Flash Memory with Greater than 1M P/E-cycle Endurance," IEEE IEDM 2004 881-884 (36.3.1-36.3.4), Dec. 13-15, 2004.

Shin et al., A Novel NAND-type MONOS Memory using 63 nm Process Technology for a Multi-Gigabit Flash EEPROMs, IEEE IEDM Technical Digest Dec. 5, 2005, pp. 327-330.

Shin et al., High Reliable SONOS-type NAND Flash Memory Cell with Al2O3 or Top Oxide, IEEE IEDM, Feb. 16-20, 2003 (MANOS).

Shin Y. et al., "A Novel NAND-type MONOS Memory using 63nm Process Technology for Multi-Gigabit Flash EEPROMs," IEEE IEDM Tech. Digest, 2005, pp. 327-330, Dec. 5-7, 2005.

Sim et al., "Fully 3-Dimensional NOR Flash Cell with Recessed Channel and Cylindrical Floating Gate—A Scaling Direction for 65nm and Beyond," 2006 Symposium on VLSI Technology Digest of Technical Papers, 2006 IEEE, pp. 1-2. Jun. 13-15, 2006.

Smullen C.W. et al., "Accelerating Enterprise Sollid-State Disks with Non-Volatile Merge Caching," Proc. Int'l Conf. on Green Computing (GREENCOMP '10) Chicago, IL, Aug. 2010, pp. 203-214.

Strauss, Karl F. et al., "Overview of Radiation Tolerant Unlimited Write Cycle Non-Volatile Memory," IEEE Mar. 18-25, 2000, pp. 399-408.

Subramanian, Vivek et al., "Low Leakage Germanium-Seeded Laterally-Crystallized Single-Grain 100-nm TFT's for Vertical Integration Applications," IEEE Electron Device Letters, vol. 20, No. 7, Jul. 1999, pp. 341-343.

Sung et al., "Multi-Layer SONOS with Direct Tunnel Oxide for High Speed and Long Retention Time," IEEE Silicon Nanoelectronics Workshop Jun. 2002 83-84.

Takata, M., et al., "New Non-Volatile Memory with Extremely High Density Metal Nano-Dots," IEEE IEDM 03-553, 22.5.1-22.5.4, Dec. 8-10, 2003.

Tanaka et al., "Bit Cost Scalable Technology with Punch and Plug Process for Ultra High Density Flash Memory," VLSI Technology, 2007 IEEE Symposium on Jun. 12-14, 2007, pp. 14-15.

Tsai et al., "Novel SONOS-Type Nonvolatile Memory Device with Suitable Band Offset in HfAIO Charge-Trapping Layer," Int'l Symp. on VLSI Tech, Systems and Applications Apr. 23-25, 2007, 2 pages.

U.S. Appl. No. 13/827,475, filed Mar. 14, 2013 S-N Hung, et al., "Programming Technique for Reducing Program Disturb in Stacked Memory Structures," 47 pp.

Walker et al., "3D TFT-SONOS Memory Cell for Ultra-High Density File Storage Applications," 2003 Symposium on VLSI Tech Digest of Technical Papers, 29-30, Jun. 12-14, 2003.

"Magnetic Bit Boost," www.sciencenews.org, Dec. 18 & 25, 2004, p. 389, vol. 166.

"New Memories Tap Spin, Gird for Battle," Science News, Apr. 3, 1999, p. 223, vol. 155.

"Optimized Thermal Capacitance in a Phase Change Memory Cell Design," IPCOM000141986D, IP.com Prior Art Database, Oct. 18, 2006, 4pp.

"Remembering on the Cheap," www.sciencenews.org, Mar. 19, 2005, p. 189, vol. 167.

"Thermal Conductivity of Crystalline Dielectrics" in CRC Handbook of Chemistry and Physics, Internet Version 2007, (87th edition), David R. Lide, ed. Taylor and Francis, Boca Raton, FL, 2pp.

Adler, D. et al., "Threshold Switching in Chalcogenide-Glass Thin Films," J. Appl/Phys 51(6), Jun. 1980, pp. 3289-3309.

Adler, David, "Amorphous-Semiconductor Devices," Sci. Amer., vol. 236, pp. 36-48, May 1977.

(56) References Cited

OTHER PUBLICATIONS

Ahn, S. J. et al., "A Highly Manufacturable High Density Phase Change Memory of 64 Mb and Beyond," IEEE IEDM Dec. 13-15, 2004, pp. 907-910.

Ahn, S. J. et al., "Highly Reliable 5nm Contact Cell Technology for 256Mb PRAM," VLSI Technology, Digest of Technical Papers, Jun. 14-16, 2005, pp. 98-99.

Aminzadeh et al., "Conduction and Charge Trapping in Polysilicon-Silicon Nitride-Oxide-Silicon Structures under Positive Gate Bias," IEEE Trans. on Electron Dev. 35(4) Apr. 1998 459-467.

Atwood, G, et al., "90 nm Phase Change Technology with u Trench and Lance Cell Elements," VLSI Technology, Systems and Applications, Apr. 23-25, 2007, pp. 1-2.

Axon Technologies Corporation paper: Technology Description, published in 1997, pp. 1-6.

Baik' Seung, et al., "High Speed and Nonvolatile Si Nanocrystal Memory for Scaled Flash Technology using Highly Field-Sensitive Tunnel Barrier," IEEE IEDM 03-545 22.3.1-22.3.4, Dec. 8-10, 2003.

Bedeschi, F. et al., "4-MB MOSFET-Selected Phase-Change Memory Experimental Chip," IEEE, Sep. 21-23, 2004, 4 PP.

Blake thesis, "Investigation of GeTeSb5 Chalcogenide Films for Use as an Analog Memory," AFIT/GE/ENG/00M-04, Mar. 2000, 121 pages.

Blomme et al., "Multilayer tunneling barriers for nonvolatile memory applications," Device Research Conf, 2002 60th DRC Digest 153-154.

Blomme et al., "Write/Erase Cycling Endurance of Memory Cells with SiO2/HfO2 Tunnel Dielectric," IEEE Trans. on Dev. and Mterials Reliability 4(3), Sep. 2004 345-351.

Buckley, J., et al., "Engineering of 'Conduction Band-Crested Barriers' or 'Dielectric Constant-Crested Barriers' in view of their application of floating-gate non-volatile memory devices," VLSI 2004, 55-56.

Chang L.-P. et al., "An Adaptive Striping Architecture for Flash Memory Storage Systems of Embedded Systems," Proc. of the IEEE RTAS, pp. 187-196, 2002.

Chang Y.-H. et al., "Endurance Enhancement of Flash-Memory Storage Systems: An Efficient Static Wear Leveling Design," Proc. of the IEEE/ACM DAC, pp. 212-217, 2007.

Chao, Der-Sheng, et al., "Low Programming Current Phase Change Memory Cell with Double GST Thermally Confined Structure," Int'l Symp on VLSI Technology, Systems and Applications, Apr. 23-25, 2007, pp. 1-2.

Chen C-H et al., "Age-Based PCM Wear Leveling with Nearly Zero Search Cost," 49th ACM/EDAC/IEEE Design Automation Conference (DAC), San Francisco, Jun. 2012, pp. 453-458.

Chen et al., "Damascene Word Line", U.S. Appl. No. 13/527,259, filed on Jun. 19, 2012, 76 pages.

Chen, An et al., "Non-Volatile Resistive Switching for Advanced Memory Applications," IEEE IEDM, Dec. 5-7 2005, 4 pp.

Chen, Y-C. et al., "An Access-Transistor-Free (0T/1R) Non-Volatile Resistance Random Access Memory (RRAM) Using a Novel Threshold Switching, Self-Rectifying Chalcogenide Device," IEDM 2003, pp. 37.4.1-37.4.4.

Chindalore, et al., "A New Combination-Erase Technique for Erasing Nitride Based (SONOS) Nonvolatile Memories," IEEE Electron Dev. Lett. 24(4) Apr. 2003, 257-259.

Cho S. et al., "Flip-N-Write: A Simple Deterministic Technique to Improve PRAM Write Performance, Energy and Endurance," Proc. of the IEEE/ACM MICRO, pp. 347-357, 2009.

Cho, et al., "Simultaneous Hot-Hole Injection at Drain and Source for Efficient Erase and Excellent Endurance in SONOS Flash EEPROM Cells," IEEE Electron Device Letters, vol. 24, No. 4, Apr. 2003, 260-262.

Cho, S. L. et al., "Highly Scalable On-axis Confined Cell Structure for High Density PRAM beyond 256Mb," Jun. 14-16, 2005 Symposium on VLSI Technology Digest of Technical Papers, pp. 96-97.

Choi et al., "Performance Breakthrough in NOR Flash Memory With Dopant-Segregated Schottky-Barrier (DSSB) SONOS Devices," Jun. 2009 Symposium on VLSI Technology Digest of Technical Papers, pp. 222-223.

Condit J. et al., "Better I/O Through Byte-Addressable, Persistent Memory," Proc. of the ACM SIGOPS 22nd Symp. on Operating Systems Principles (SOSP '09) Oct. 2009, Big Sky, Montata, 14pp.

DiMaria, D.J., et al., "Conduction Studies in Silicon Nitride: Dark Currents and Photocurrents," IBM J. Res. Dev. May 1977, 227-244.

Eitan, et al., "NROM: A Novel Localized Trapping, 2-Bit Nonvolatile Memory Cell," IEEE Electron Device Lett 21(11) Nov. 2000, 543-545.

European search report dated Jun. 10, 2013 for related application EP 13154198, 6 pp.

European Search Report from EP07252779 mailed Nov. 5, 2009, 7 pages.

Extended EP Search Report in application No. EP12163608.8, mailed Sep. 20, 2012, 8 pages.

Ferreira A.P. et al., "Increasing PCM Main Memory Lifetime," Proc. of the Conference on Design, Automation and Test in Europe (Date '10) Dresden, Mar. 2010, pp. 914-919.

Ferreira A.P. et al., "Using PCM in Next-generation Embedded Space Applications," Proc. of the IEEE RTAS, pp. 153-162, 2010. Sep. 24, 2010.

Fukuzumi et al. "Optimal Integration and Characteristics of Vertical Array Devices for Ultra-High Density, Bit-Cost Scalable Flash Memory," IEEE Dec. 2007, pp. 449-452.

Gal E. et al., "Algorithms and Data Structures for Flash Memories," ACM Computing Surveys, 37(2):138-163, 2005. Apr. 28, 2005.

Gibson, G. A. et al., "Phase-change Recording Medium that Enables Ultrahigh-density Electron-beam Data Storage," Applied Physics Letter, 2005, 3 pp., vol. 86.

Gill, Manzur et al., "A High-Performance Nonvolatile Memory Technology for Stand-Alone Memory and Embedded Applications," 2002 IEEE-ISSCC Technical Digest (TD 12.4), 7 pp.

Gleixner, "Phase Change Memory Reliability", 22nd NVSMW, Aug. 26, 2007, 46 pages.

Goebel, B., et al., "Fully Depleted Surrounding Gate Transistor (SGT) for 70 nm DRAM and Beyond," IEEE IEDM 2002, 10.8.1-10.8.4.

Govoreanu et al., "An Investigation of the Electron Tunneling Leakage Current Through Ultrathin Oxides/High-k Gate Stacks at Inversion Conditions," IEEE SISPAD Intl. Conf. Sep. 3-5, 2003 287-290.

Govoreanu et al., "Simulation of Nanofloating Gate Memory with High-k Stacked Dielectrics," IEEE SISPAD Intl. Conf. Sep. 3-5, 2003 299-302.

Govoreanu et al., "Variot: A Novel Multilayer Tunnel Barrier Concept for Low-Voltage Nonvolatile Memory Devices," IEEE Electron Dev. Lett. 24(2) Feb. 2003 94-10.

Ha, Y. H. et al., "An Edge Contact Type Cell for Phase Change RAM Featuring Very Low Power Consumption," Jun. 10-12, 2003 Symposium on VLSI Technology Digest of Technical Papers, pp. 175-176.

Hanzawa, Satoru, et al., "A 512kB Embedded Phase Change Memory with 416kB/s Write Throughput at 100mA Cell Write Current," ISSCC 2007, Session 26, Non-Volatile Memories/26.2, 3 pages.

Happ, T. D. et al., "Novel None-Mask Self-Heating Pillar Phase Change Memory," 2006 Symposium on VLSI Technology, 2 pp.

\* cited by examiner

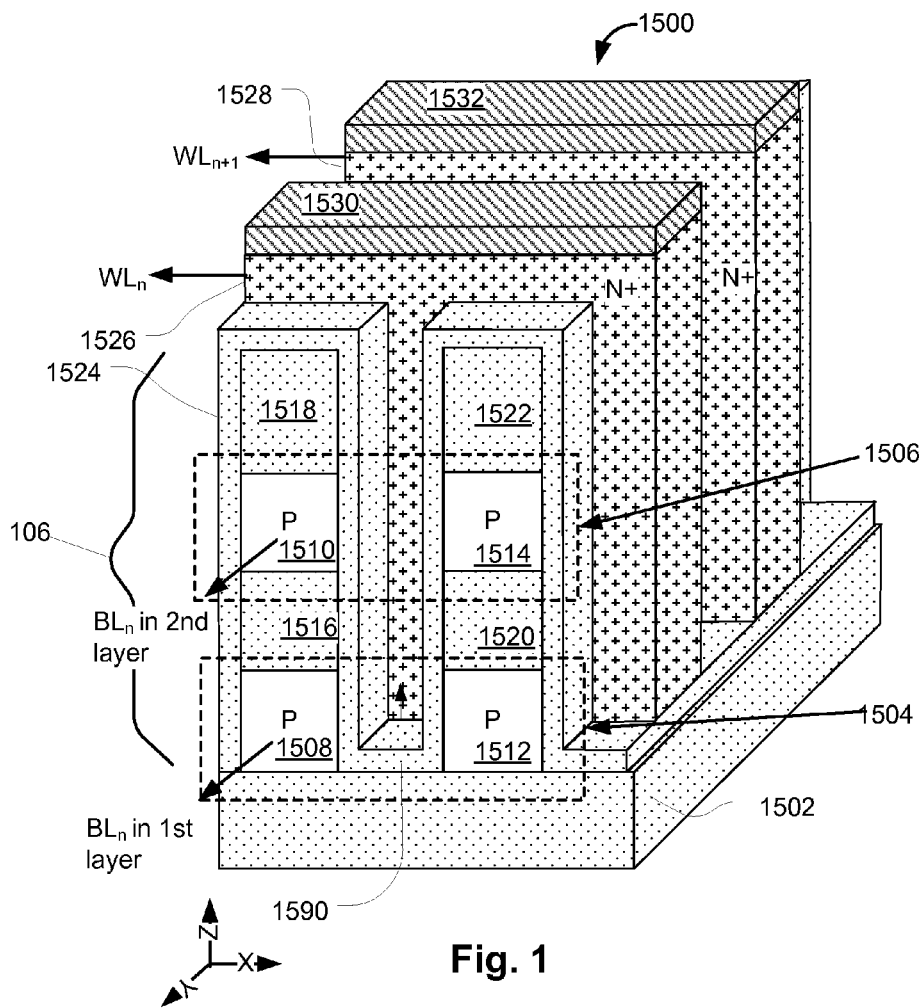
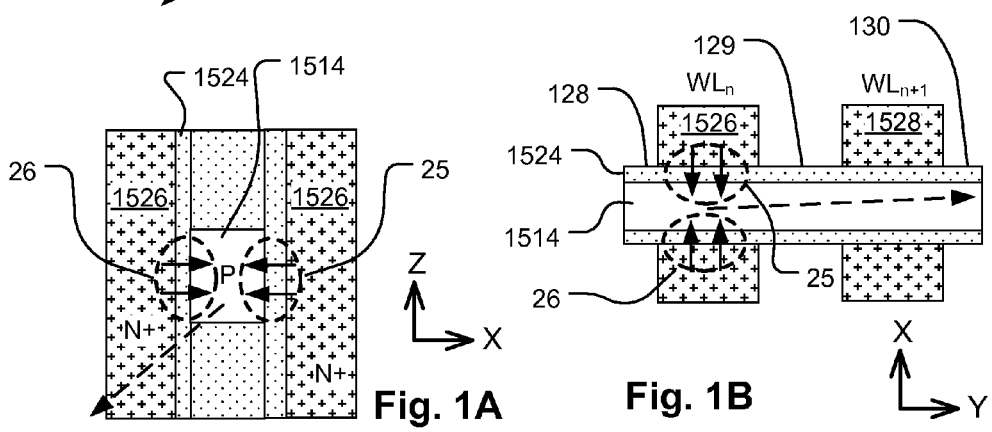
Fig. 1
Fig. 1A    Fig. 1B

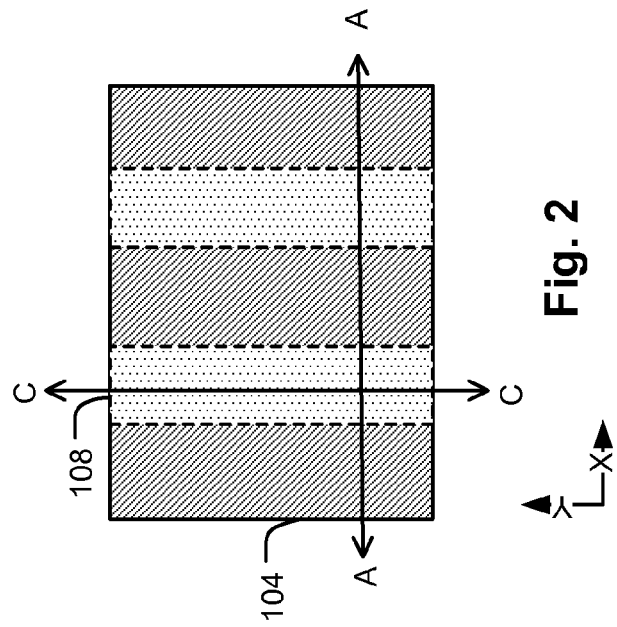
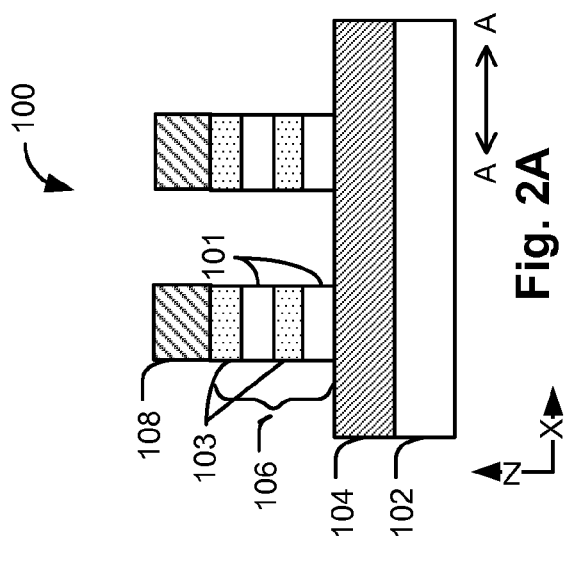
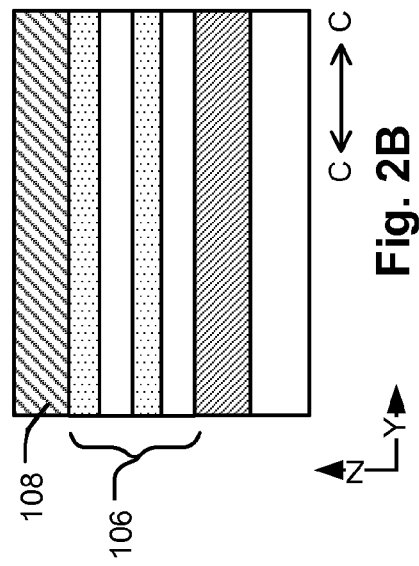

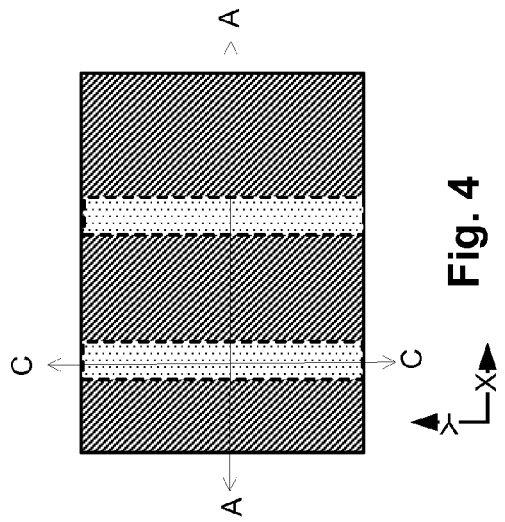
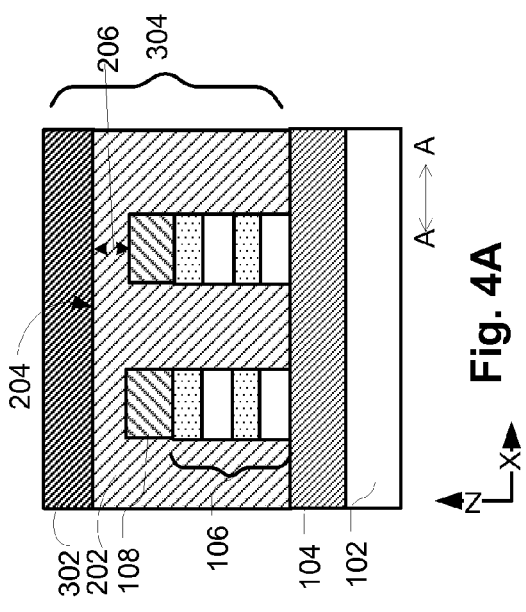
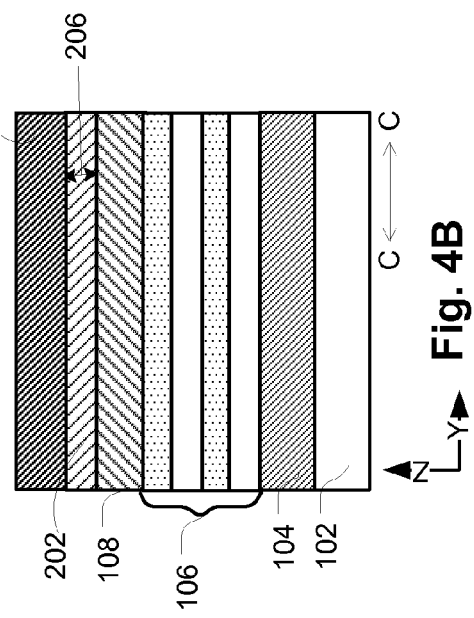

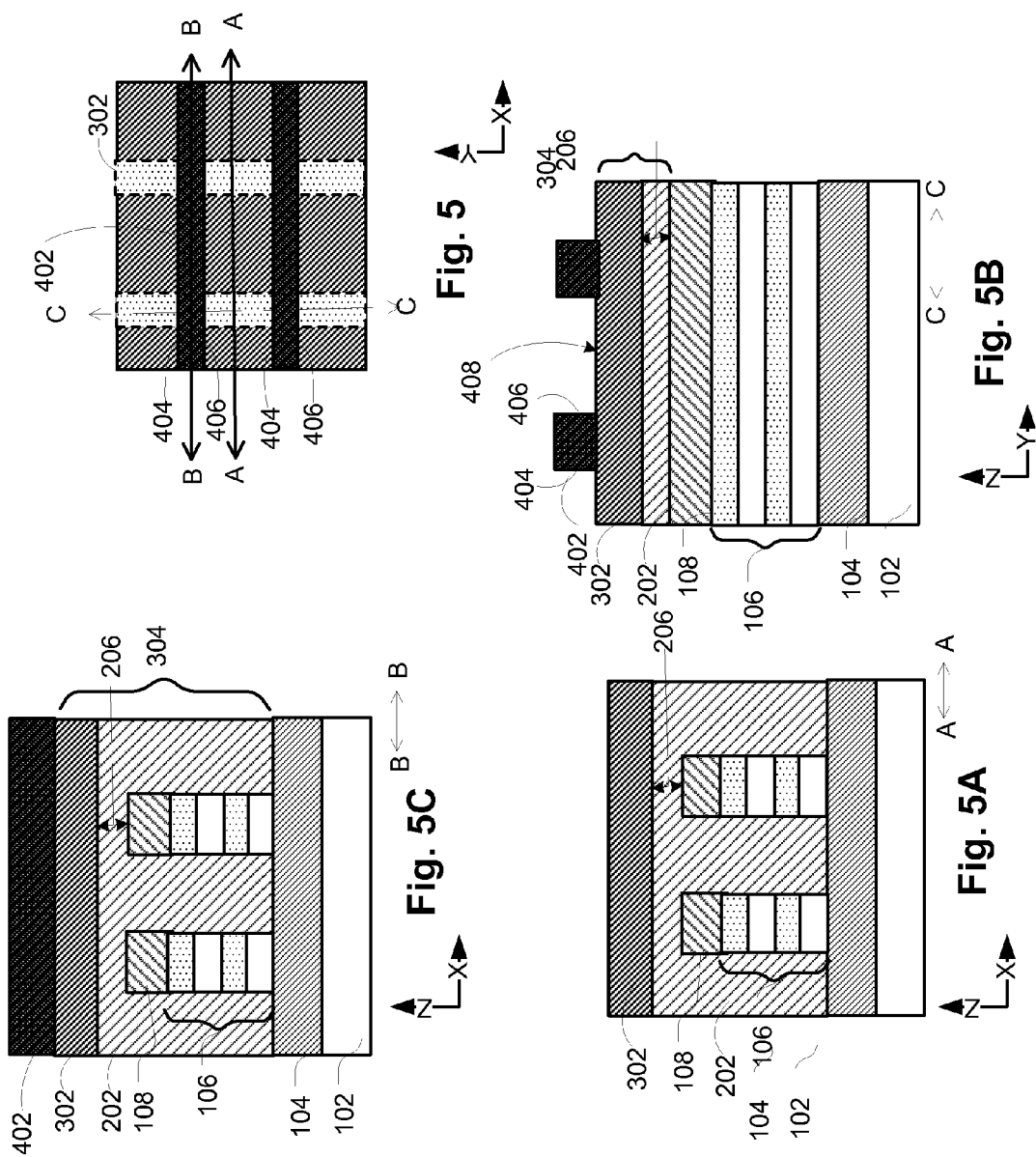

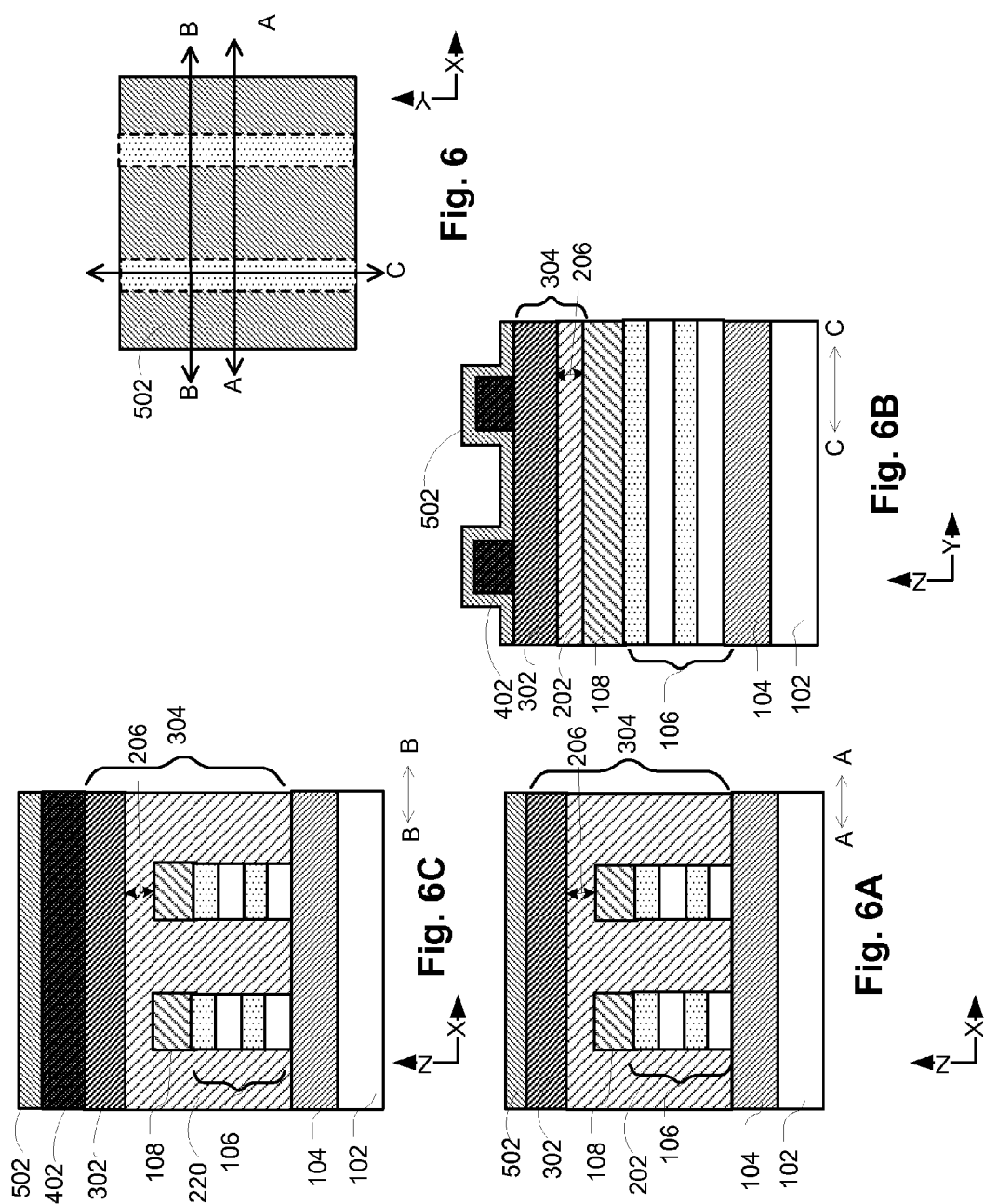

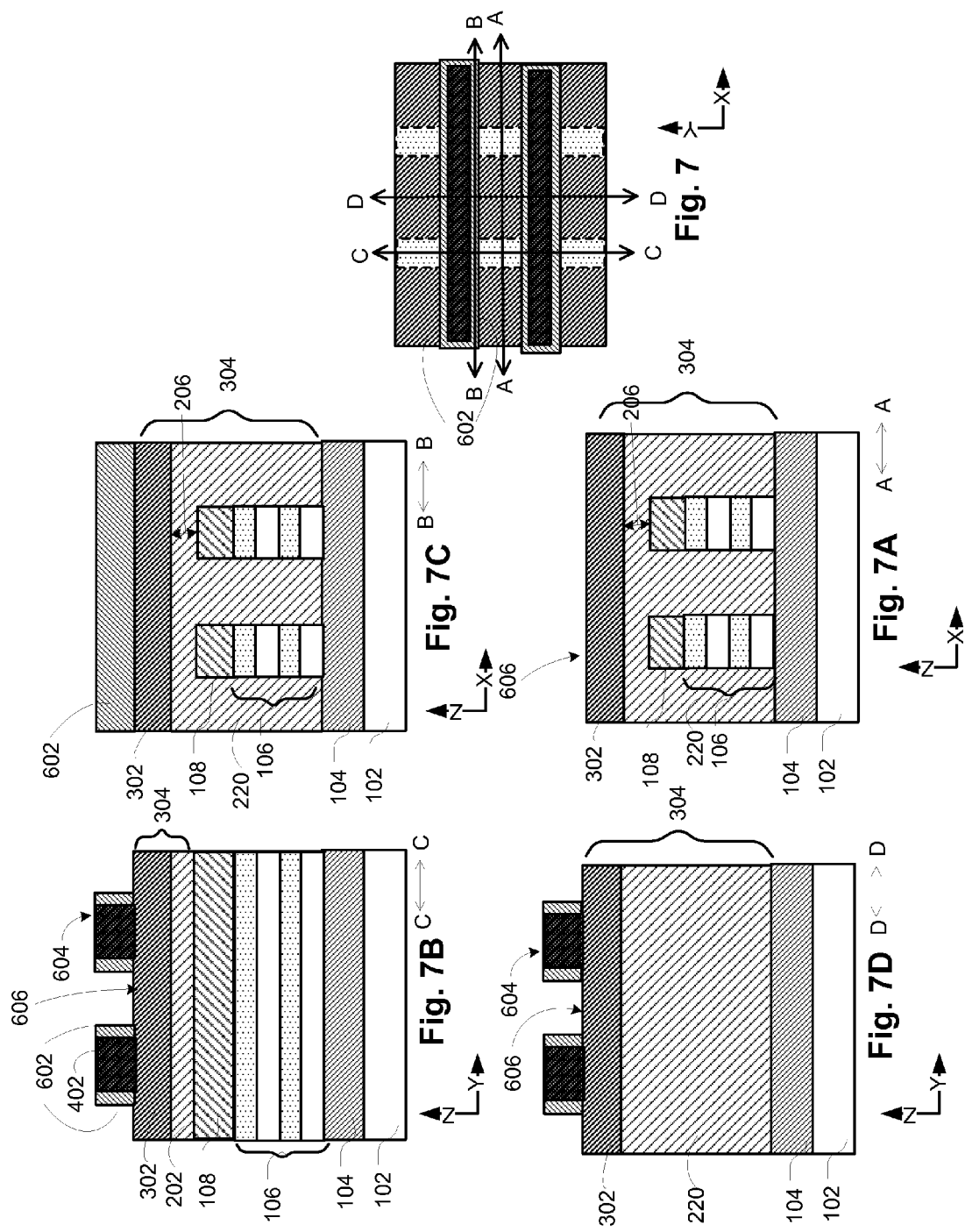

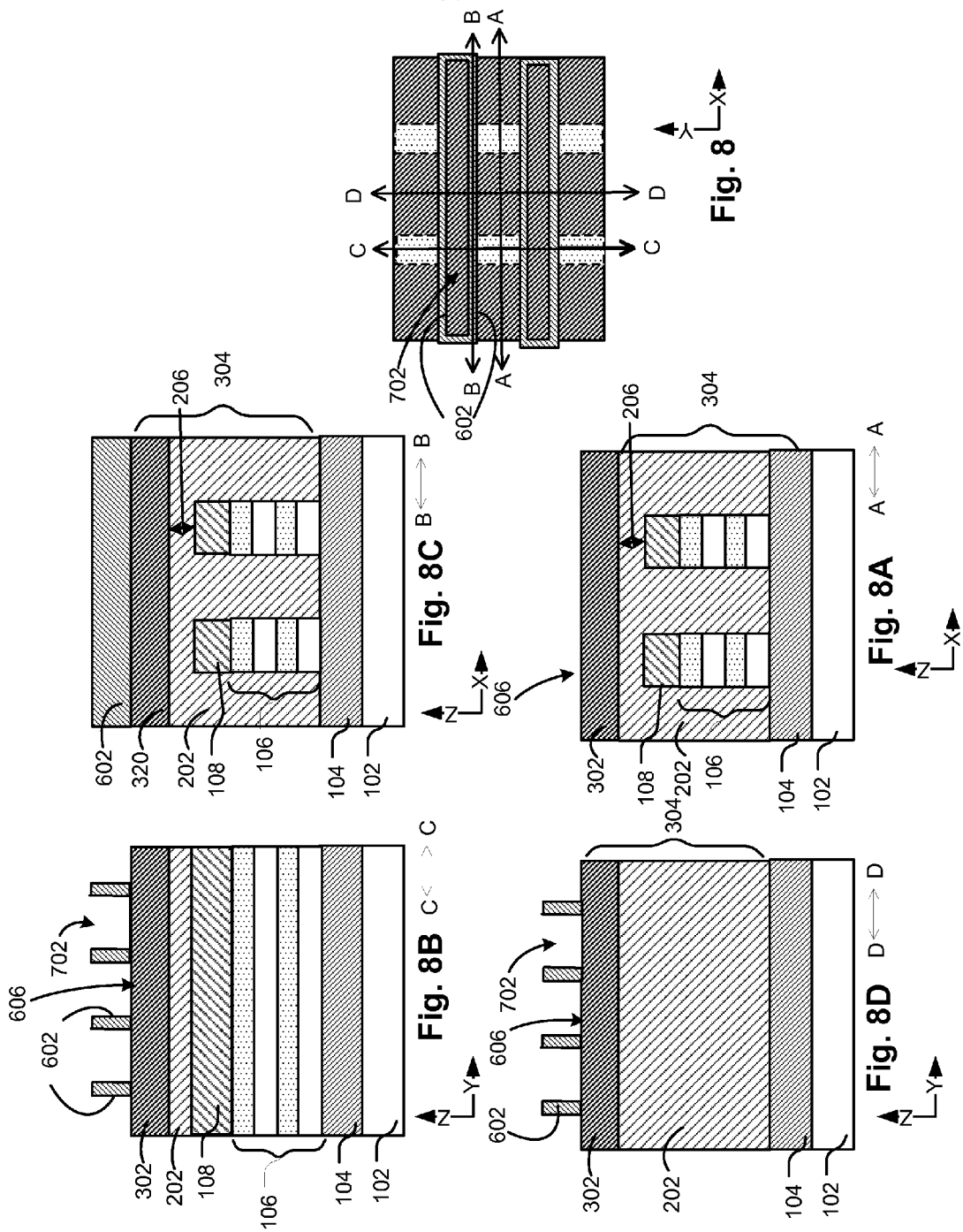

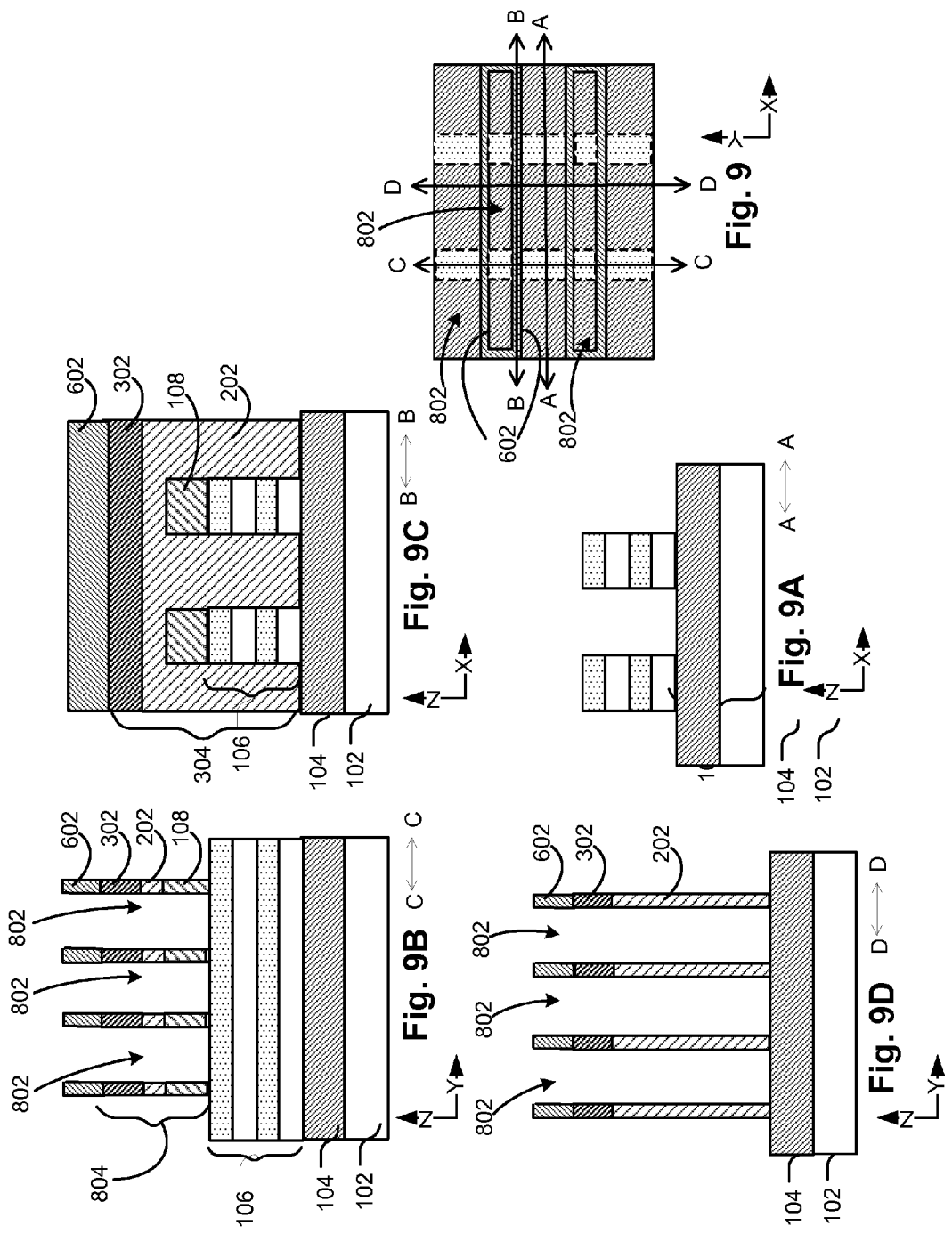

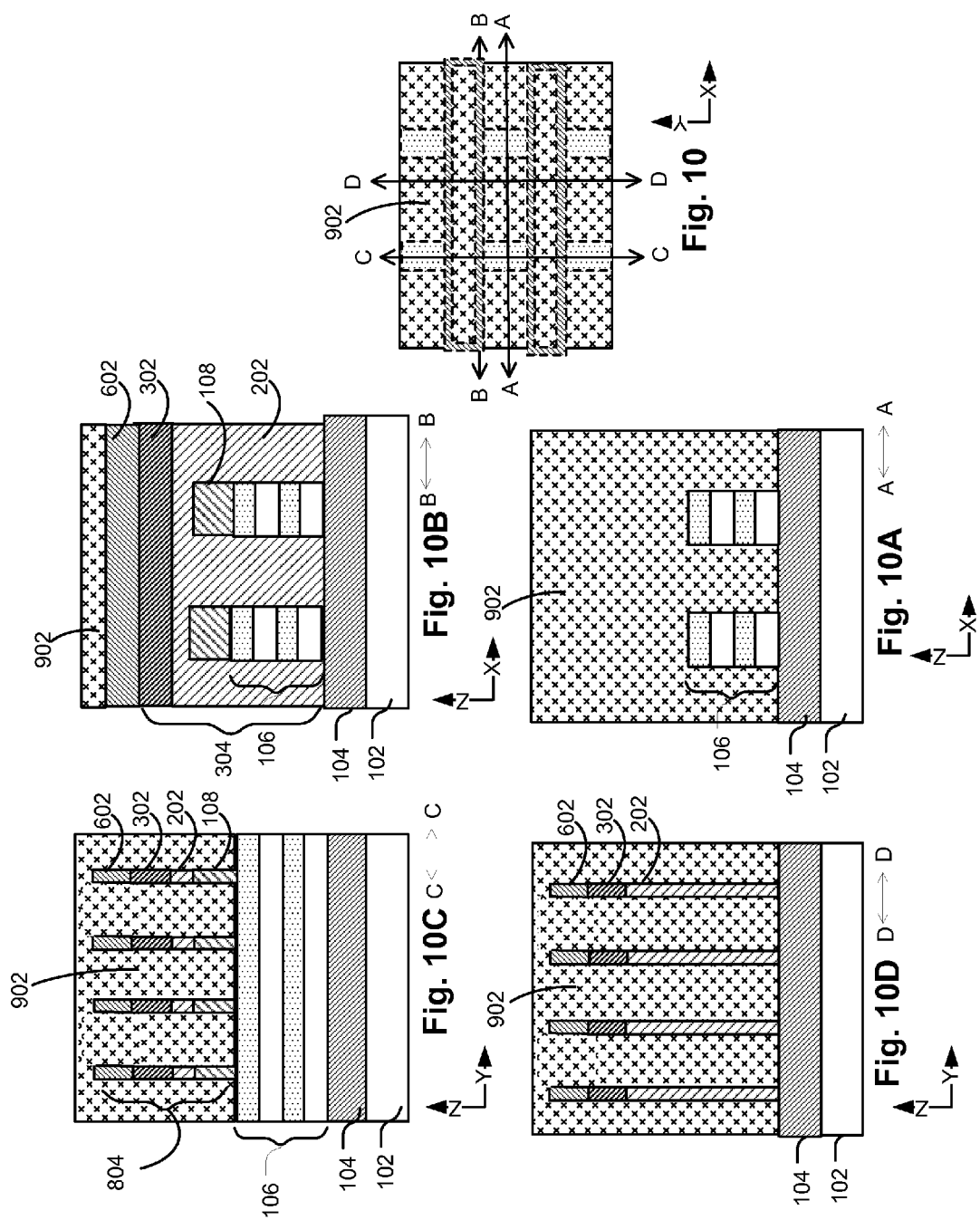

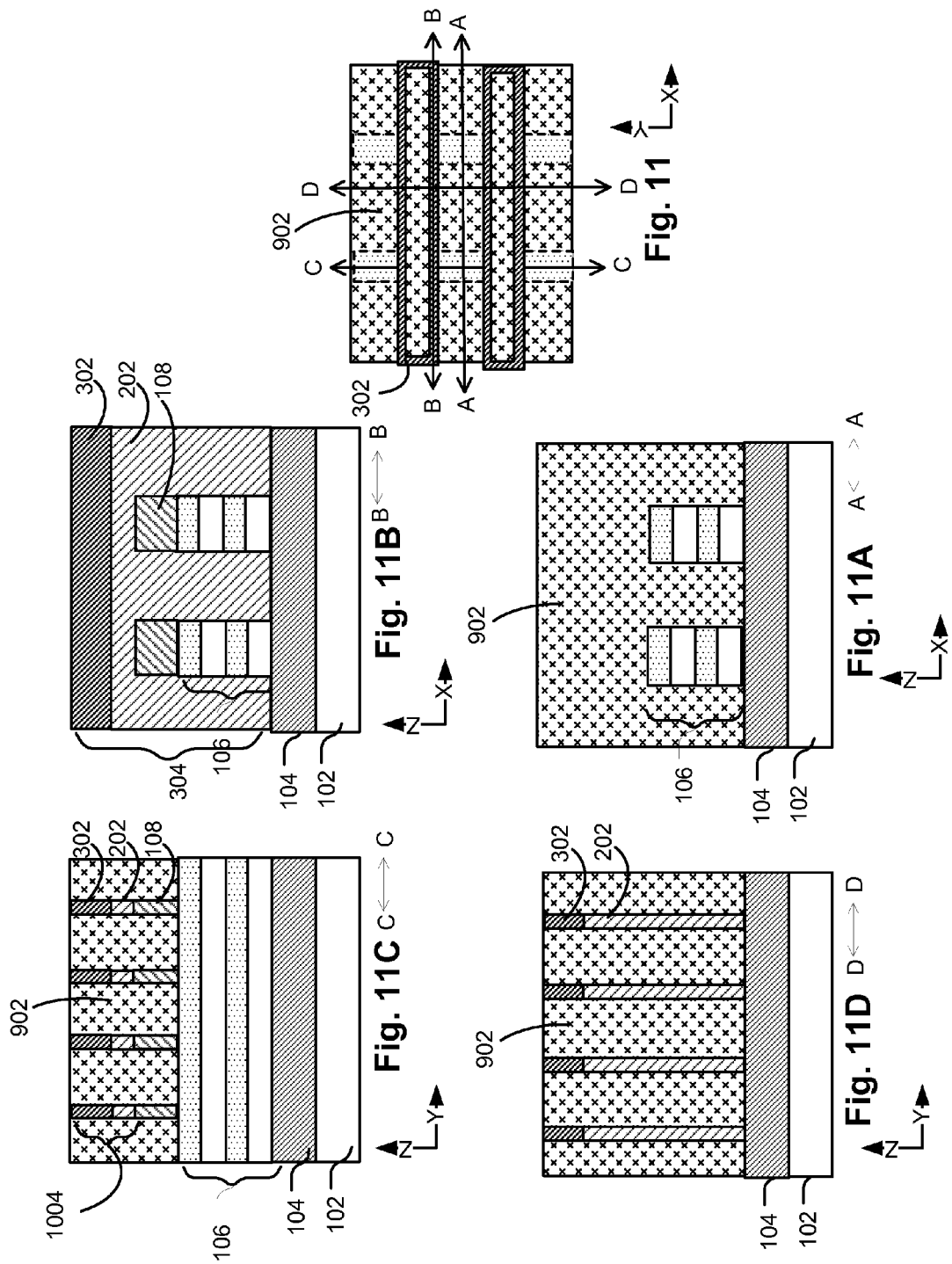

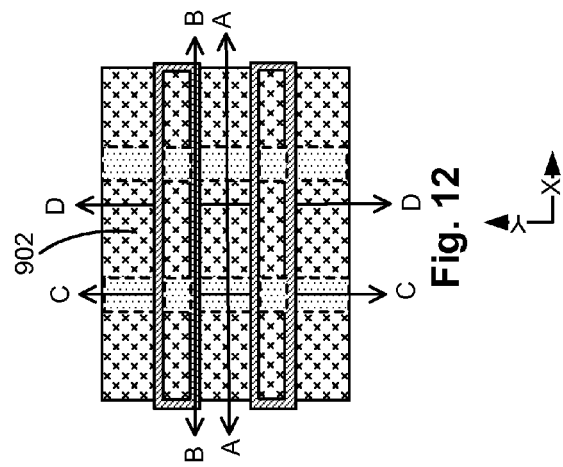
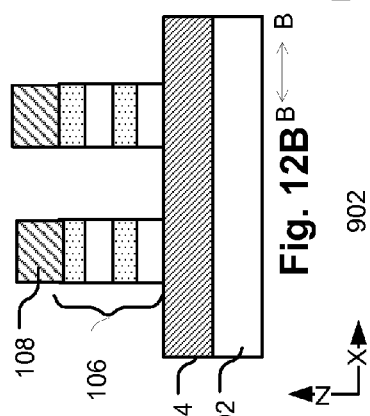
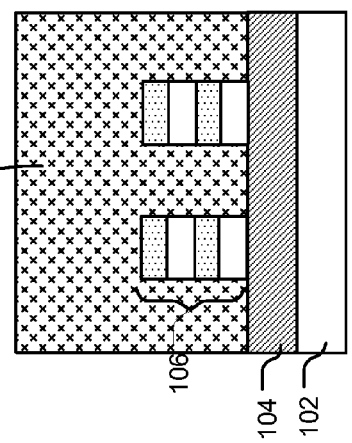
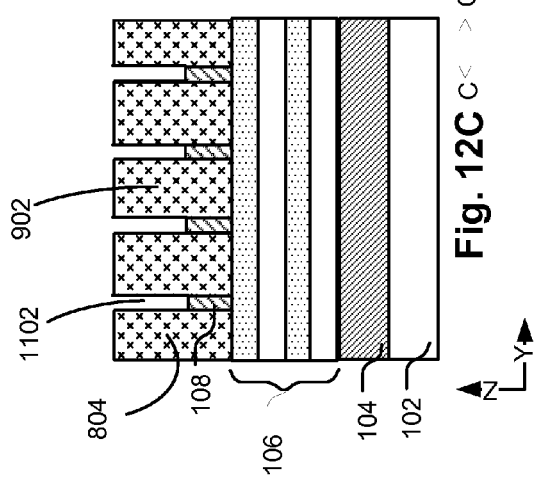
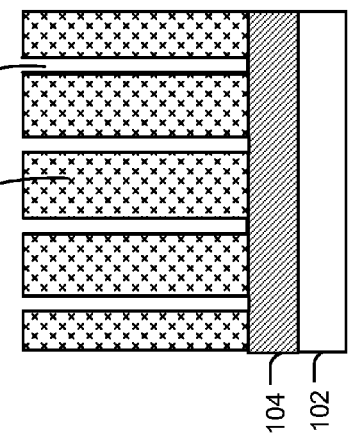

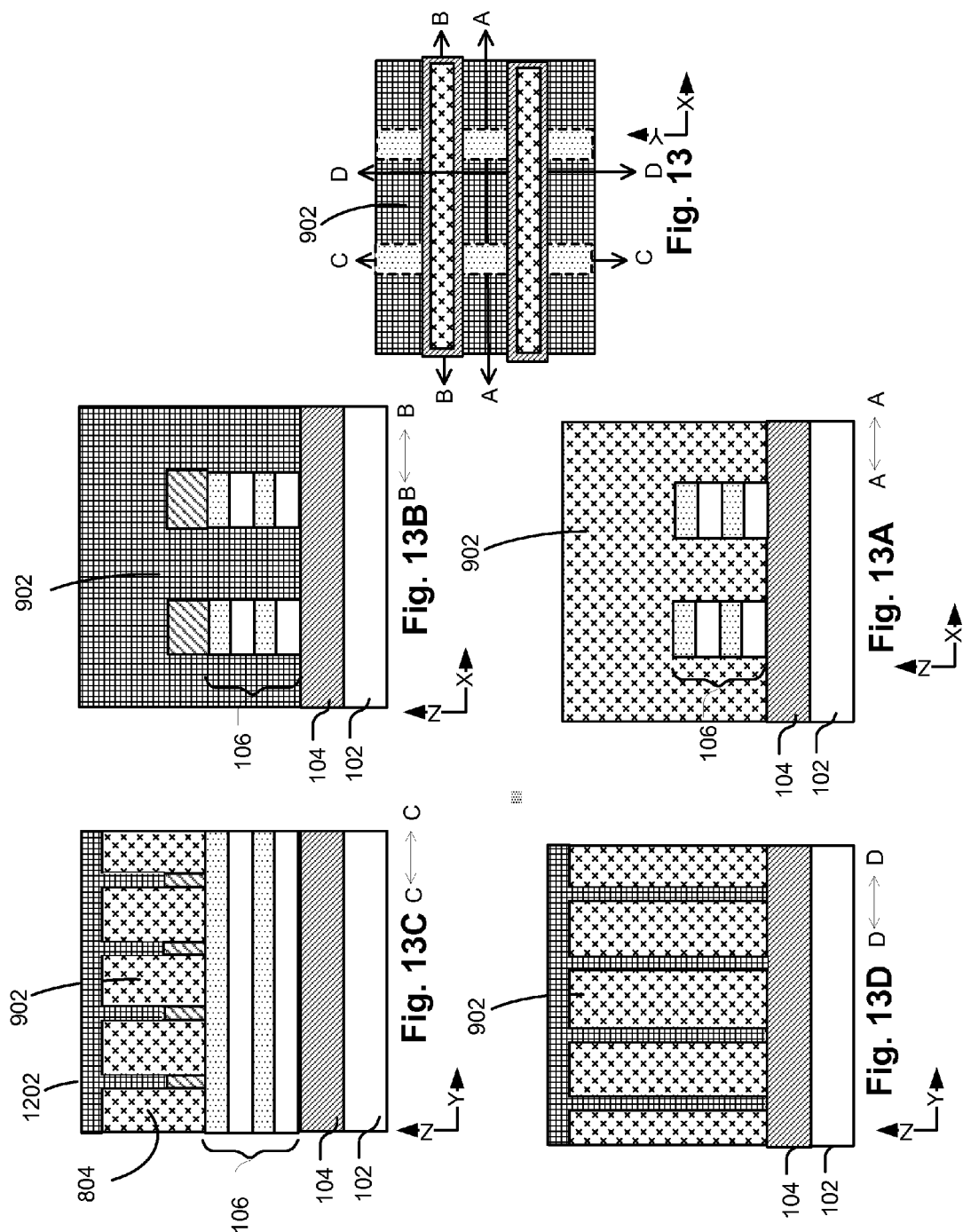

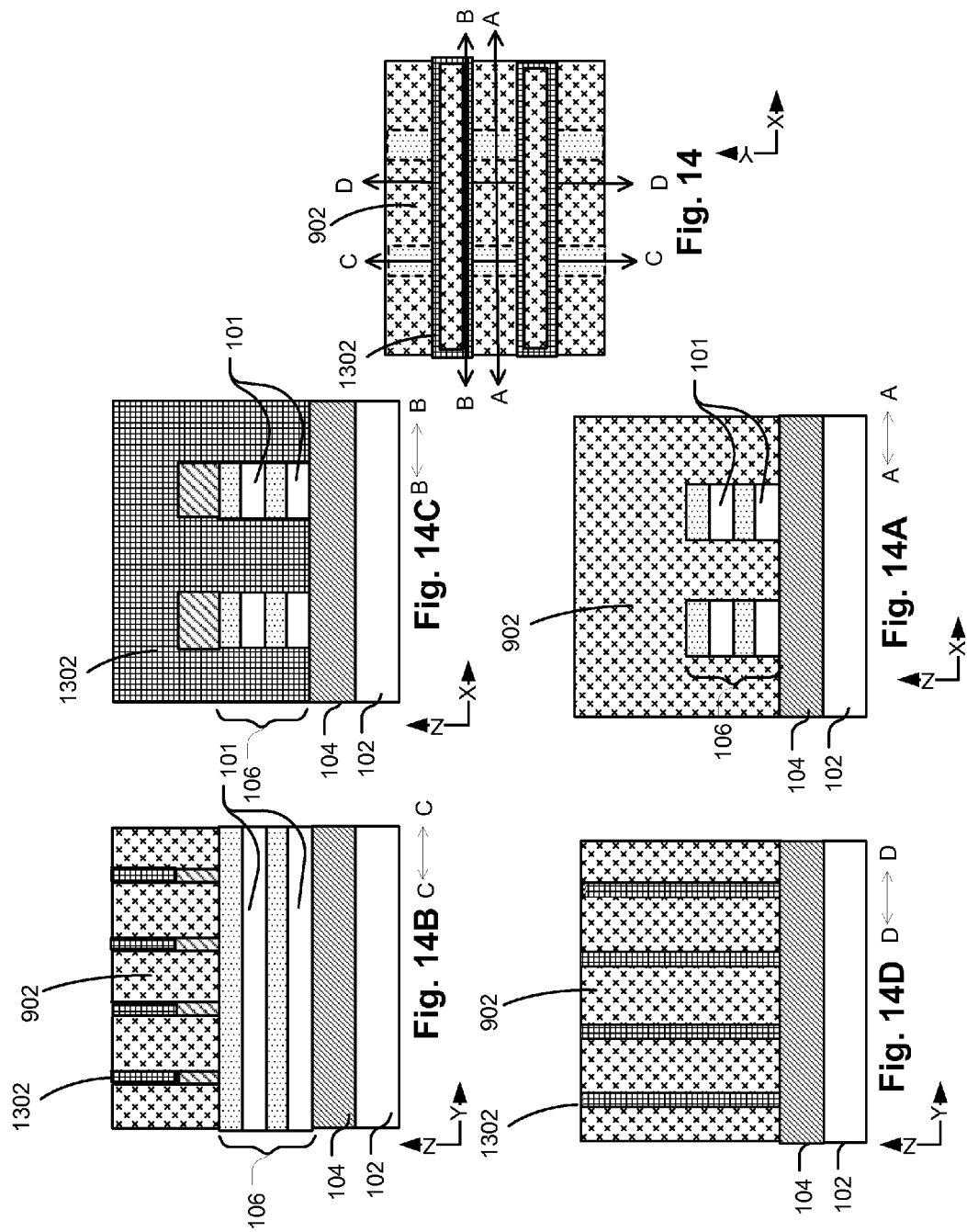

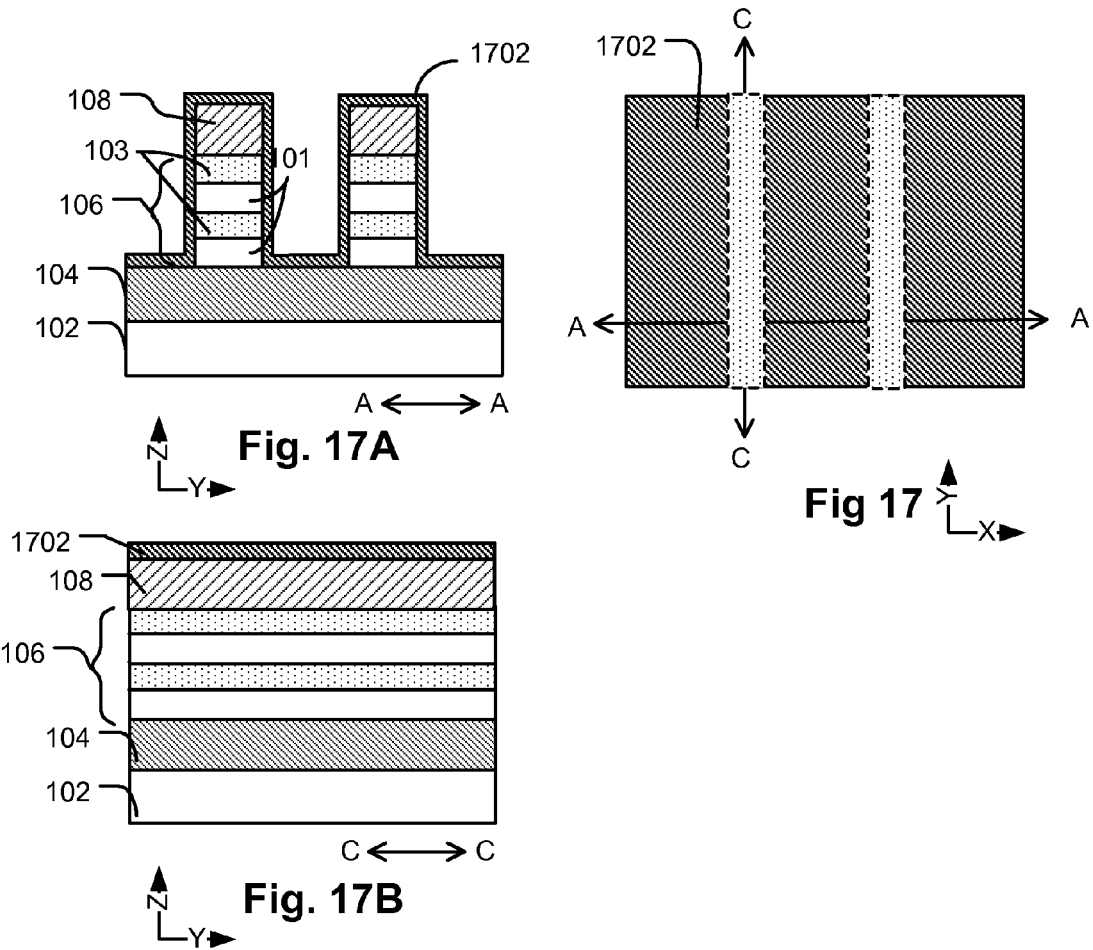

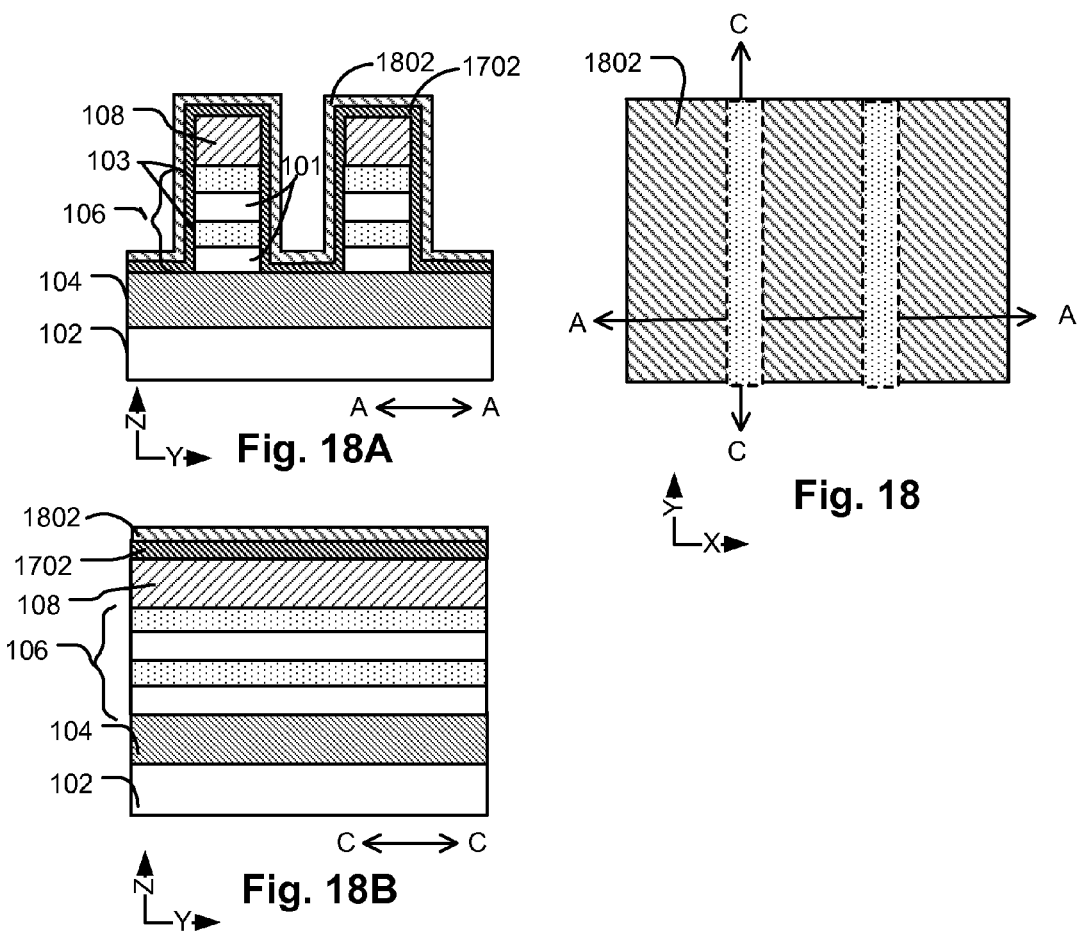

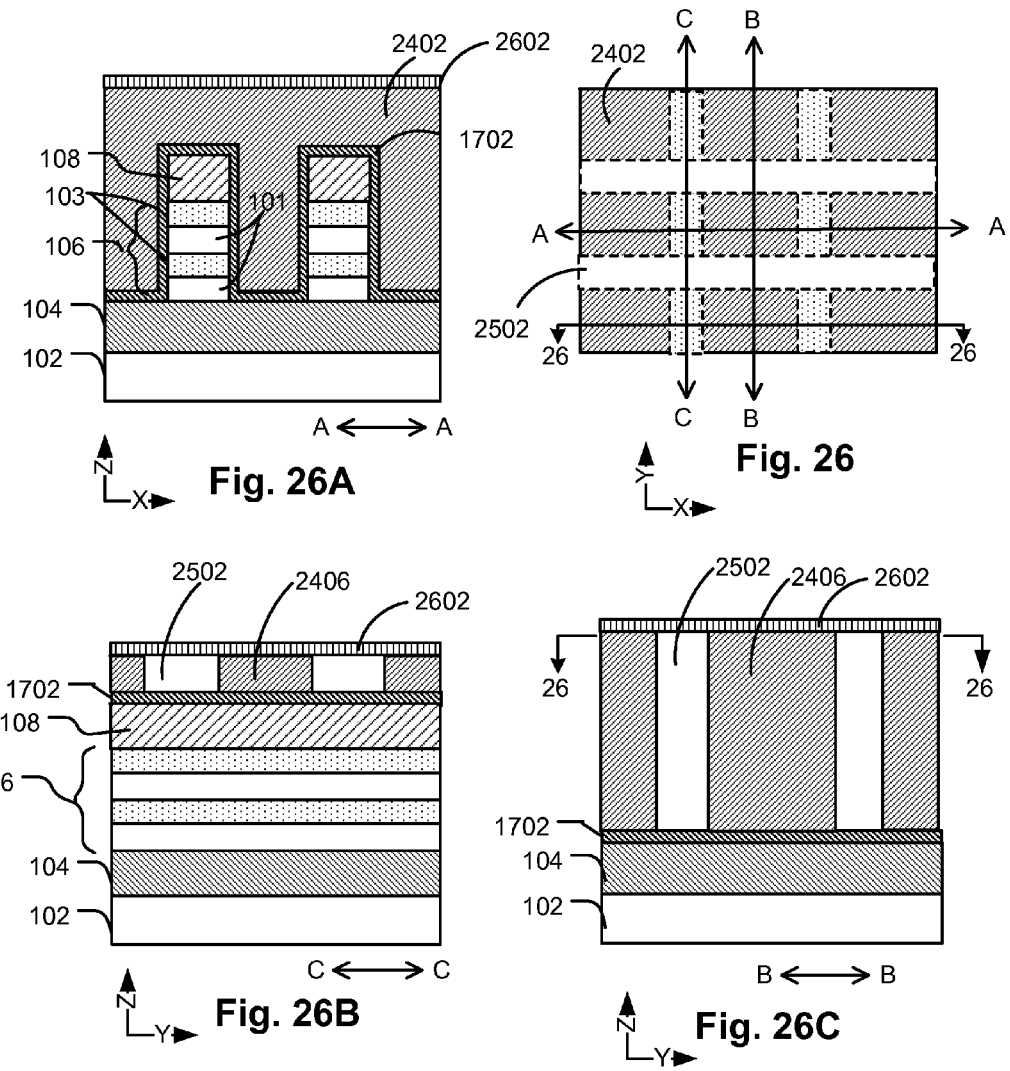

DAMASCENE CONDUCTOR FOR 3D ARRAY

RELATED APPLICATIONS

This application claims benefit of U.S. Provisional Patent Application No. 61/778,477 filed on 13 Mar. 2013, which application is incorporated by reference as if fully set forth herein.

BACKGROUND

The present invention relates to high density memory devices. In particular, embodiments according to the present invention provide a method and a structure for a conductor connected to multiple planes in a three-dimensional high density memory device.

SUMMARY

A technology is described that includes various embodiments of a 3D structure having, and various embodiments of a method to form a 3D structure having a conductor that connects to multiple planes, such as a high density wordline or bit line structure, for a three dimensional (3D) memory device.

For certain three dimensionally stacked memory devices, bit lines or word lines for memory cells are stacked in spaced apart ridge like structures arranged to extend in a first direction. In such structures, complementary wordlines or bit lines, can be configured that include damascene features between the spaced apart ridges in a high aspect ratio trench or trenches arranged to be aligned in a second direction, such as perpendicular to the first direction. The damascene conductors can be formed using double patterned masks to etch sub-lithographic sacrificial lines, forming a fill over the sacrificial lines, and then removing the sacrificial lines to leave trenches that act as the damascene molds in the fill. Then the trenches are filled with the conductor material. Memory cells in this example are disposed at the cross points of the stacked bit lines or word lines and the crossing word lines or bit lines, forming a 3D memory array. In one aspect, the technology includes 3D memory comprising dielectric charge trapping memory cells, which have a bandgap engineered tunneling layer, a charge trapping layer, and a high-K blocking dielectric layer, and in which the conductor material comprises a high work function material.

Many benefits can be achieved by ways of present invention over conventional techniques. Various other aspects and advantages are described throughout the specification and the appended claims.

BRIEF DESCRIPTION OF THE DRAWINGS

FIG. 1 is a perspective illustration of the 3D memory device including damascene conductors. FIG. 1A and FIG. 1B are cross-sections of a memory cell taken from the structure of FIG. 1.

FIGS. 2-14, 2A-14A, 2B-14B, 5C-14C, and 7D-14D illustrate stages in a method for forming a conductor structure for a 3D memory device.

FIGS. 17-26, 17A-26A, 17b-26B, and 20C-26C illustrate stages in an alternative method for forming a conductor structure for a 3D memory device.

DETAILED DESCRIPTION

Figure 3:
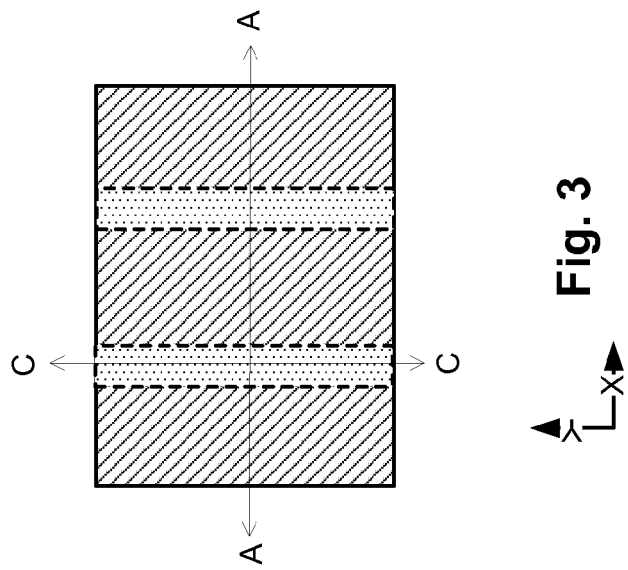

A detailed description of various embodiments is described with reference to the Figures. The following description will typically be with reference to specific structural embodiments and methods. It is to be understood that there is no intention to limit the invention to the specifically disclosed embodiments and methods but that the invention may be practiced using other features, elements, methods and embodiments. Preferred embodiments are described to illustrate the present invention, not to limit its scope, which is defined by the claims. Those of ordinary skill in the art will recognize a variety of equivalent variations on the description that follows. Like elements in various embodiments are commonly referred to with like reference numerals.

FIG. 1 is a perspective view of an example of a 3D memory device 1500 including damascene conductors. Various insulating materials are not shown to better illustrate memory stack and the damascene conductor structures, and others. As shown, the 3D memory device 1500 is formed overlying a substrate having an insulating layer 1502 formed thereon. The substrate can include one or more integrated circuits and other structures. Only two planes 1504, and 1506 are shown but the number of planes can be extended to any number of layers N, where N is an integer having a value greater or equal to one. In some examples, the number of planes can be equal to two, four, eight, sixteen, thirty-two or in general $2^n$ layers. As shown, the 3D memory device includes a plurality of stacks 106 of semiconductor strips 1508, 1510, 1512, and 1514 separated by insulating material 1516, 1518, 1520, and 1522. The stacks are ridge-shaped extending on the Y-axis as illustrated, so that the semiconductor strips 1508, 1510, 1512, and 1514 can be configured as bodies including channel regions of flash memory cell strings, for example in horizontal NAND string configurations. In other embodiments, the strips can be configured as word lines for in vertical NAND string configurations, where the damascene conductors 1526 comprise bodies including the channel regions of the cells.

Semiconductor strips 1508 and 1512 can act as memory cell strings in a first memory plane 1504. Semiconductor strips 1510 and 1514 can act as memory cell strings in second memory plane 1506. As illustrated, a layer 1524 of memory material, such as a multilayer dielectric charge trapping material or an anti-fuse material, coats the plurality of stacks of semiconductor strips in this example, and at least on the side walls of the semiconductor strips in other examples. FIG. 1A shows a cross-section view taken in the X-Z plane of the memory cell formed at the intersection of word line 1526 and semiconductor strip 1514. Channel regions 25 and 26 are formed on both sides of the semiconductor strip 1514 between the word line 1526 and the semiconductor strip 1514. In the embodiment described here, each memory cell has two channel regions 25 and 26, one on each side of the semiconductor strip 1514. FIG. 1B shows a cross-section view taken in the X-Y plane of the memory cells formed at the intersection of the word lines 1526, 1528 and the semiconductor strip 1514. Source/drain regions (e.g. 128, 129 and 130) of memory cells are formed in the semiconductor strip 1514. Channel regions (e.g. 25 and 26) are between the source/drain regions (e.g. 128 and 129). The layer 1524 of memory material can include a multilayer dielectric charge trapping material or an anti-fuse material. In an example where the layer 1524 of memory material includes an anti-fuse material, the current path from the word line 1526 through the layer 1524 of memory material and down the semiconductor strip 1514 is illustrated. Electron current as illustrated by the solid arrows in FIG. 1B, flows from the n+ word lines 1526 into the channel regions (e.g. 25 and 26) in the p-type semiconductor strips 1514, and along the semiconductor strips 1514 (- - arrow) to sense amplifiers where it can be measured to indicate the state of a selected memory cell.

In the embodiment of FIG. 1, a plurality of damascene conductors 1526, 1528 is arranged orthogonally over the plurality of stacks of semiconductor strips. The damascene conductors 1526, 1528 have surfaces conformal with the plurality of stacks of semiconductor strips, within the trenches (e.g. 1590) defined by the plurality of stacks, and defining a multi-layer array of interface regions at crosspoints between side surfaces of the semiconductor strips 1508, 1510, 1512, and 1514 on the stacks and word lines 1526, 1528. Damascene conductors 1526 and 1528 can be formed using the method as in FIGS. 2-14. As shown, a layer of silicide (e.g. tungsten silicide, cobalt silicide, titanium silicide or nickel silicide) 1530, 1532 can be formed over the top surfaces of the word lines 1526, 1528.

Depending upon the implementation, layer 1524 of memory material can comprise multilayer dielectric charge storage structures. For example, a multilayer dielectric charge storage structure includes a tunneling layer comprising a silicon oxide, a charge trapping layer comprising a silicon nitride and a blocking layer comprising a silicon oxide. In some examples, the tunneling layer in the dielectric charge storage layer can comprise a first layer of silicon oxide less than 2 nanometers thick, a layer of silicon nitride less than 3 nanometers thick and a layer of silicon oxide less than 3 nanometers thick. In the alternative, the memory material comprises an anti-fuse material such as a silicon dioxide, silicon oxynitride or other silicon oxide, for example having a thickness on the order of 1 to 5 nanometers can be utilized. Other anti-fuse materials may be used, such as silicon nitride. For antifuse embodiments, the semiconductor strips 1510 and 1514 can be a semiconductor material with a first conductivity type (e.g. p-type). The word lines 1526, 1528 can be a semiconductor material with a second conductivity type (e.g. n-type). For example, the semiconductor strips 1510 and 1514 can be made using p-type polysilicon while the damascene conductors 1526, 1528 can be made using relatively heavily doped n+-type polysilicon. For antifuse embodiments, the width of the semiconductor strips should be enough to provide room for a depletion region to support the diode operation. As result, memory cells comprising a rectifier formed by the p-n junction with a programmable anti-fuse layer in between the anode and cathode are formed in the 3D array of cross-points between the polysilicon strips and lines.

In other embodiments, different programmable resistance memory materials can be used as the memory material, including metal oxides like tungsten oxide on tungsten or doped metal oxide semiconductor strips, and others. Such materials can be programmed and erased at multiple voltages or currents, and can be implemented for operations storing multiple bits per cell.

Co-pending U.S. patent application Ser. No. 13/078,311, entitled MEMORY ARCHITECTURE OF 3D ARRAY WITH ALTERNATING MEMORY STRING ORIENTATION AND STRING SELECT STRUCTURES, (U.S. Patent Application Publication US 2012/0182806), issued as U.S. Pat. No. 8,503,213 on 6 Aug. 2013, is incorporated by reference for description of representative 3D memory structures, and of manufacturing technologies for a structure like that of FIG. 1.

FIGS. 2-14, 2A-14A, 2B-14B, 5C-14C, 7D-14D, are diagrams illustrating stages of a method of forming a damascene conductor structure for a 3D memory device according to various embodiments, advantageously using a double pattern process to implement sub-lithographic widths for the damascene conductors. Processes other than double patterning, including other sub-lithograph patterning processes and lithographic patterning processes, can be used in alternative implementations.

FIGS. 2, 2A, and 2B illustrate a stage in a manufacturing method for implementation of damascene conductors on a 3D structure, showing a partially formed memory device 100 which can be provided for example using the technologies of copending U.S. patent application Ser. No. 13/078,311. A top view diagram of partially formed memory device 100 is illustrated in FIG. 2. First cross sectional view along direction A-A crossing the ridges of the plurality of stacks of semiconductor strips (for example, stack 106 illustrated in FIG. 1) and between the damascene conductors to be fabricated, and second cross-sectional view along direction C-C along a ridge (stack 106 in FIG. 1), are respectively shown in FIGS. 2A and 2B. Partially formed memory device 100 includes a semiconductor substrate 102. Semiconductor substrate 102 can be a single crystal silicon material, a silicon germanium material, a silicon on insulator (commonly known as SOI) substrate, and others. A dielectric material 104 is formed overlying the semiconductor substrate. Depending on the embodiment, dielectric material 104 can be silicon dioxide, silicon nitride, a dielectric stack of alternating layer of silicon oxide and silicon nitride (for example, ONO), a high K dielectric material, a low K dielectric material, and others. The partially formed memory device includes a stack of semiconductor strips 106 for a string of memory cells, the stack having N layers, wherein N is an integer greater than 1. In certain implementation, N can be powers of two ($2^n$), that is 2, 4, 8, 16, 32 and so on. Each of the N layers can comprise a semiconductor strip 101 for one or more memory cell strings extended in the C-C direction and arranged in respective memory planes separated by a suitable dielectric material 103. Semiconductor strip 101 can be a bit line conductor for the 3D memory device. Semiconductor strip 101 may be formed from an undoped, or a suitably doped polycrystalline silicon material (p doped or n doped) or others. Partially formed memory device 100 further includes a dielectric layer 108 overlying each of the stacks 106. As illustrated, direction A-A is perpendicular to direction C-C.

Figure 3A:
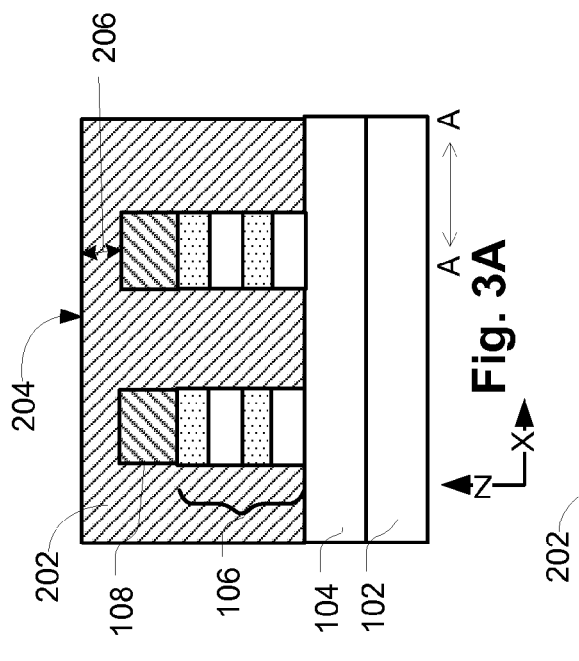
Figure 3B:
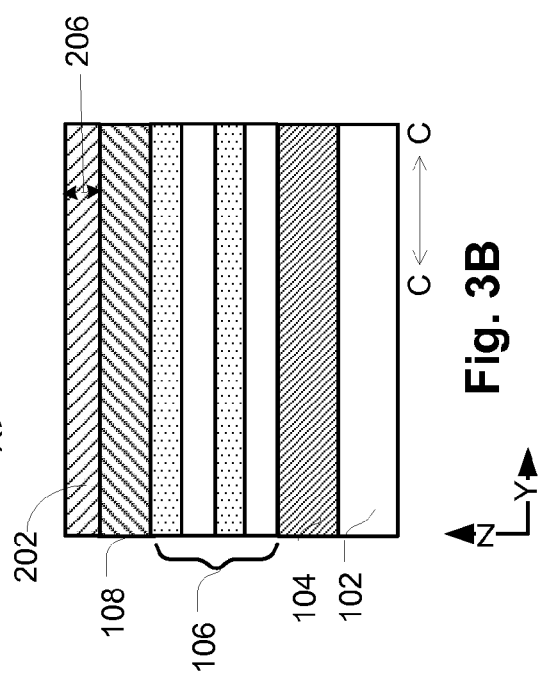

Referring to FIGS. 3, 3A, and 3B. FIGS. 3, 3A, and 3B show the corresponding structure in FIGS. 2, 2A, and 2B followed by deposition of a first dielectric material 202. As shown, first dielectric material 202 overlies 3D spaced apart stack of semiconductor strips 106 and fills a gap separating stack of semiconductor strips 106. First dielectric material 202 may be formed by a spin on coating process from an organic dielectric material. First dielectric material 202 can have a substantially planar surface 204 as deposited. In other embodiments, first dielectric material may be subjected to a planarization process to form planarized surface region 204. The planarization process can be an etch back process using reactive ions in a plasma environment. Alternatively, the planarization process can be a chemical mechanical polishing process. As shown, first dielectric material 202 maintains a thickness 206 overlying dielectric layer 108.

As shown in FIGS. 4, 4A, and 4B, a second dielectric material 302 is formed overlying first dielectric material 202 of the corresponding structure of FIGS. 3, 3A, and 3B, which is substantially planarized. First dielectric material 202 and second dielectric material 302 form a first insulator 304 for use in fabricating conductive lines for the 3D memory device. Second dielectric material 302 can be a silicon oxide, silicon nitride, silicon oxynitride, a high K dielectric material, a low K dielectric material, and others. In certain embodiments, second dielectric material 302 can have an anti-reflective characteristic to facilitate subsequent lithographic steps. Example of such dielectric material having anti-reflective property can be a silicon rich silicon oxide material or a silicon rich silicon nitride material. In various implementations, first dielectric material 202 and second dielectric material 302 are selected to have certain desired etch characteristics to facilitate formation of a trench structure for damascene conductive lines (for example, word lines 1526 and 1528 in FIG. 1) for the 3D memory device. For example, layer 202 can comprise an organic dielectric layer (ODL), and layer 302 can comprise a silicon containing hard mask bottom (SHB) anti-reflection coating (BARC), both of these are organic materials. These organic films can be removed by a dry ashing process, using an $O_2$ plasma or an $O_2/N_2$ mixture plasma. In addition, the dry ashing process has very high selectivity to polysilicon, silicon oxide or silicon nitride. Thus, loss of polysilicon, silicon oxide or silicon nitride will be very little during ODL/SHB patterning. ODL could be replaced by other conformal film having a sustainable process temperature higher than ODL, such as the commercially available TOPAZ™ from Applied Material of Santa Clara, Calif., USA. The TOPAZ™ material can be removed by conventional ashing process, using $O_2$ plasma or $N_2/O_2$ plasma, for example.

A next manufacturing stage includes implementing a double patterning scheme to form sacrificial lines of material between, and over the plurality of spaced apart stacks for forming the damascene conductive lines. Steps for the double patterning scheme are illustrated in various views in FIGS. 5-9, 5A-9A, 5B-9B, 5C-9C, and 7D-9D. In other embodiments, double patterning is not utilized. Rather a direct lithographic patterning process, or other patterning technology can be applied.

Referring to FIGS. 5, 5A, 5B, and 5C. The double patterning scheme includes forming a first patterned material structure 402 overlying second dielectric material 302 of first insulator 304 in the corresponding structure of FIGS. 4, 4A, and 4B using for example a photoresist, or other photosensitive material. Additionally, FIG. 5C illustrates a third cross-sectional view in direction B-B, crossing the ridges and along a damascene conductor (for example, wordline 1526 or 1528 in FIG. 1). The double patterning scheme includes forming a first patterned material structure 402. First patterned material structure 402 can be formed by first depositing a photosensitive material overlying second dielectric material 302, which can have an antireflective property in certain implementation. The photosensitive material is subjected to a first patterning process to form first patterned material structure 402 overlying second dielectric material 302 of first insulator 304 while exposing a surface region 408 of second dielectric material 302. As shown, first patterned material structure 402 is configured in a strip structure and aligned along direction A-A, perpendicular to direction C-C along the string of memory cells. Each of the first patterned material structure 402 includes a first side 404 and a second side 406. First patterned material structure 402 provide for a first patterned mask for the double patterning scheme. In various embodiments, first patterned material structure 402 is associated with a word line for the 3D memory device.

FIGS. 6, 6A, 6B, and 6C illustrate a step in the double patterning scheme of the present method. As shown, the double patterning scheme includes forming a third dielectric material 502 ($1^{st}$ LTO) conformably overlying first patterned material structure 402 and the exposed surface region 408 of second dielectric material 302 of first insulator 304 in corresponding structure of FIGS. 5, 5A, 5B and 5C. Third dielectric material 502 is selected to be a suitable sidewall spacer material in various embodiments. Third dielectric material 502 can be a low temperature silicon oxide deposited at a temperature no greater than about 450 degrees Celsius and can range from about 50 to 450 degrees Celsius. Deposition process may be a low pressure CVD process using silane as silicon precursor in presence of an oxygen species. Other low temperature deposition process for forming the low temperature oxide can include a plasma enhanced CVD process using tetraethylorthosilicate (commonly known as TEOS) as a silicon oxide precursor, and others.

Referring now to FIGS. 7, 7A, 7B, 7C, and 7D. As shown in FIGS. 7, 7A, 7B, 7C and 7D, in various embodiments, the double patterning scheme of the present method subjects third dielectric material 502 in corresponding structures in FIGS. 6, 6A, 6B, and 6C to an anisotropic etch. The anisotropic etch selectively removes a portion of third dielectric material to cause formation of sidewall spacers 602. A fourth cross sectional view in direction D-D between ridges 106 and parallel to direction C-C is illustrated FIG. 7D. Sidewall spacer 602 abuts respectively first side 404 and second side 406 of first patterned material structure 402. A first top surface region 604 of first patterned material structure 402 and a second top surface region 606 of second dielectric material 302 are also exposed, as shown in FIG. 7. The etching process can be a directional etching process using a fluorine containing species such as $CHF_3$ as an etchant. Depending on the application, oxygen may be added to the etchant gas for a desired etch profile.

FIGS. 8, 8A, 8B, 8C, and 8D illustrate the corresponding structure of FIGS. 7, 7A, 7B, 7C, and 7D, following removal of first patterned material structure 402. As shown, the double patterning scheme of the present method removes first patterned material structure 402 to form an opening 702. First patterned material structure 402 can be removed by exposing the first photosensitive material to an ultraviolet light of suitable range of wavelength to solubilize the first photosensitive material. As shown, sidewall spacer 602 is maintained. Sidewall spacer 602 is aligned to extend in direction B-B perpendicular to each of the plurality of stacks of semiconductor strips 106.

Referring to FIGS. 9, 9A, 9B, 9C, and 9D, the double patterning scheme of the present method includes subjecting second dielectric material 302 and first dielectric material 202 of the first insulator 304 to a first etching process to form a second opening structure 802 using sidewall spacers 602 as a patterned mask. FIGS. 9, 9A, 9B, 9C, and 9D illustrate the corresponding structures in FIGS. 8, 8A, 8B, 8C, and 8D following the first etching process. As shown, the first etching process causes a formation of an opening structure 802 and a second material structure 804. Second material structure 804 forms at least part of a sacrificial line of materials for the damascene conductor in various embodiments. Opening structure 802 exposes a top surface region of the stack of semiconductor strips 106 and exposes a top surface region of dielectric material 104 in between the stack of conductor strips, as shown. Second material structure 804 includes third dielectric material 502 (which provides for a side wall spacer material) and first insulator 304. As described, first insulator 304 comprises second dielectric material 302 and first dielectric material 202 in various implementations. The etching process for layer 202 (for example, ODL) and layer 302 (for example, SHB), which are organic films can be a conventional dry ashing process. The dry ashing process could be using O₂ only plasma or O₂/N₂ plasma. In addition, the dry ashing process has very high selectivity to polysilicon, silicon oxide or silicon nitride. Therefore the loss of polysilicon, silicon oxide or silicon nitride will be very little during ODL/ SHB patterning and the side wall spacer is substantially maintained during the dry ashing process. Additionally, semiconductor strips 106 would not be affected by the dry ashing process. A wet etch, being isotropic, is not preferable at this stage as it may undercut layer 202 or layer 302.

Referring to FIGS. 10, 10A, 10B, 10C, and 10D, the method includes depositing a fourth dielectric material 902 (2$^{nd}$ LTO) as an insulator fill or a fill material overlying second material structure 804, which functions as sacrificial lines of materials for the damascene conductor, and filling opening structure 802. FIGS. 10, 10A, 10B, 10C, and 10D show the corresponding structure of FIGS. 9, 9A, 9B, 9C, and 9D following the deposition of fourth dielectric material 902 for the fill material. Fourth dielectric material 902 can be, for example, a low temperature silicon oxide deposited at a temperature no greater than about 450 degrees Celsius. Deposition process may be a low pressure CVD process using silane as silicon precursor in presence of an oxygen species. Other low temperature deposition process for forming the low temperature oxide can include a plasma enhanced CVD process using tetraethylorthosilicate (commonly known as TEOS) as a silicon oxide precursor, and others.

FIGS. 11, 11A, 11B, 11C, and 11D illustrate the corresponding structure of FIGS. 10, 10A, 10B, 10C, and 10D following a second etching process to planarize fourth dielectric material 902. The second etching process further forms sacrificial lines of materials 1004 from second material structure 804. As shown, the second etching process removes a portion of fourth dielectric material 902 to expose a first insulator surface 1002. First insulator surface 1002 includes a surface of second dielectric material 302. The second etching process uses second dielectric material 302 in third material structure 804 as an etch stop material. As noted, second dielectric material 302 can comprise a silicon rich silicon oxide material, or an organic material such as silicon-contained hard mask BARC, or other material which has a different etch selectivity from third dielectric material 502 and fourth dielectric material 902, each of which can comprise a low temperature silicon oxide material.

The present method of forming a damascene conductor structure for the 3D memory device uses first insulator 304 comprising second dielectric material 302 and first dielectric material 202 in third material structure 804 as sacrificial lines of materials.

FIGS. 12, 12A, 12B, 12C and 12D show the corresponding structure in FIGS. 11, 11A, 11B, 11C, and 11D following removal of second dielectric material 302 and first dielectric material 202 from remaining of third material structure 804. For an organic dielectric material, second dielectric material 302 may be removed using a suitable organic solvent such as acetone. Subsequently, first dielectric material 202 is also removed from third material structure 804 using a high selective etch process. Such high selective etch process can be a wet etch.

An opening structure 1102 is formed in portions of the fourth direction material 902 previously filled by sacrificial lines of materials 1004. As shown, opening structure 1102 extends to a surface region of dielectric layer 108 and a surface region of dielectric material 104. Opening structure 1102, which acts in effect as a mold for formation of damascene conductors, is characterized by a plurality of patterned trenches in the insulator fill or fill material and configured perpendicular relatively to spaced apart stacks of semiconductor strips 106 in various embodiments. At this stage, layer 202 and layer 302, both of which can be organic materials, could be removed either by wet etch or by dry etch. For example, acetone or other conventional photoresist removal solvents can be used to strip layers 202 and 302. Dry etch could be, for example, a dry ashing process, the same as described above in connection with FIG. 9.

Depending on the implementation, a memory material or an antifuse material (not shown) can be formed over each of the spaced apart stacks before the steps described above with reference to FIG. 2, or can be formed on the stacks in exposed region in opening structure 1102.

FIGS. 13, 13A, 13B, 13C, and 13D show the corresponding structure in FIGS. 12, 12A, 12B, 12C, and 12D after deposition of a conductive material 1202. Conductive material 1202 fills opening structure 1102 and covers a surface region of the insulating fill comprising fourth dielectric material 902. Depending on the embodiment, conductive material 1202 can be a metal material such as copper, aluminum, tungsten and the likes deposited using metallization processes for integrated circuits. Alternatively, conductive material 1202 can be a polycrystalline silicon (polysilicon) material having a suitable impurity characteristic. The polysilicon material can be deposited using techniques such as chemical vapor deposition (CVD), for example, low pressure CVD, using silane (SiH4) or chlorosilane as silicon precursor. In certain implementation, conductive material 1202 can be polysilicon material having a p+ type impurity. The p+ type impurity can be provided by a boron species co-deposited with the polysilicon material. In other implementation, the boron species may also be incorporated into the polysilicon material using an implantation process. Depending on the application, the polysilicon material may also be doped using n+ type impurity. Such n+ type impurity may be provided by arsenic, phosphorus, antimony, and others. The impurity polarity of the polysilicon material may be opposite to that of the bit line polysilicon material (if use) for rectification in certain application. In certain application, a silicide material can be formed overlying the polysilicon material (n+ doped or p+ doped) to enhance a conductivity of the polysilicon material. The silicide material can be cobalt silicide, nickel silicide, tungsten silicide, cobalt silicide, titanium silicide, and others.

As shown in FIGS. 14, 14A, 14B, 14C, and 14D, conductive material 1202 of corresponding structures in FIGS. 13, 13A, 13b, and 13D is subjected to a planarization process to remove the conductive material from the surface region of the insulator fill comprising fourth dielectric material 902. As illustrated, the planarization process forms a plurality of damascene conductive lines 1302 in insulating fill comprising fourth dielectric material 902. The planarization process also electrically and physically isolates each of the damascene conductor lines 1302. In various embodiments, the planarization process can be a chemical mechanical polishing process using fourth dielectric material 902 as a polish stop. In certain embodiments, damascene conductor lines 1302 provide for a wordline structure for the 3D memory device. As shown, damascene conductive lines 1302 overlie the plurality of spaced apart stacks of semiconductor strips 106 and disposed orthogonally relative to the spaced apart stacks of conductors. Memory elements are formed at each of the crosspoints of the semiconductor strips 101 in the plurality of spaced apart stacks 106 and conductive lines 1302.

Figure 15:
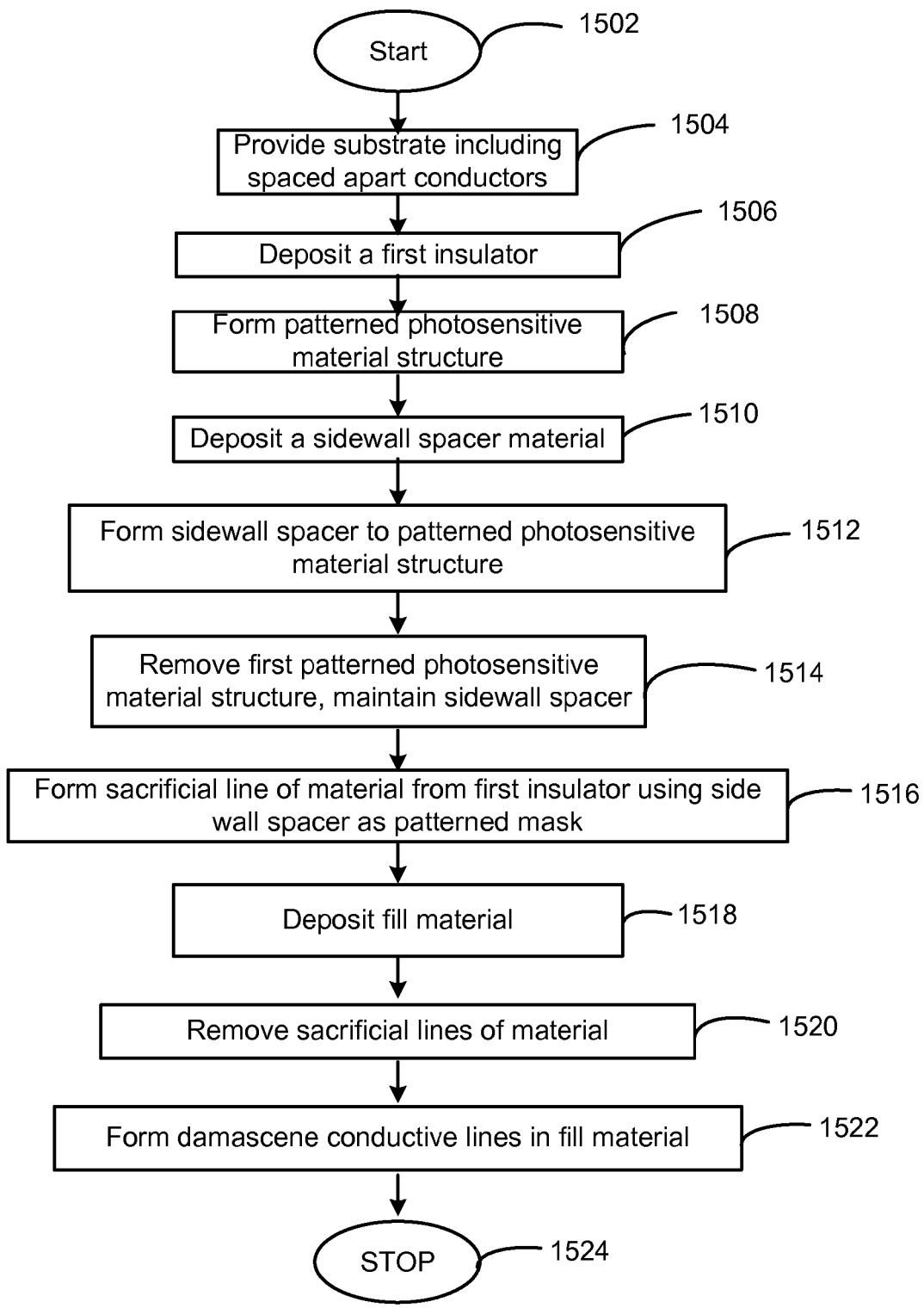
FIG. 15 illustrates a process flow for forming the conductor structure for a 3D memory device.

FIG. 15 illustrates a process flow diagram for a method of forming a damascene conductor structure for a 3D memory device using double patterning according to various embodiments of the present technology. As an example of this method, and not in a limiting sense, reference will be made to various structural elements of the example of FIGS. 2-14 D. As shown, the method comprises:

Step 1502: a start step.

Step 1504: providing a semiconductor substrate having a surface region, the substrate can include one or more spaced apart stacks of semiconductor strips 106 formed thereon.

Step 1506: depositing a first insulator 304 overlying the substrate, the first insulator includes a dielectric stack comprising one or more dielectric material layers.

Step 1508: forming a patterned photosensitive material structure 402 arranged orthogonal relative to the one or more spaced apart conductors.

Step 1510: depositing a sidewall spacer material 502 conformably overlying the patterned photosensitive material structure 402.

Step 1512: forming a sidewall spacer 602 to the patterned photosensitive material structure configured to abut respectively a first side and a second side of the first photosensitive material structure;

Step 1514: removing patterned photosensitive material structure 402 and maintaining sidewall spacer 602, sidewall spacer 602 is disposed orthogonal relative to the one or more spaced apart stacks of semiconductor strips 106.

Step 1516: forming sacrificial lines of material 1104 from first insulator 304 using the sidewall spacer as a patterned mask.

Step 1518: depositing a fill material 902 overlying the sacrificial lines of material 1104 and filling gaps between the sacrificial lines of material.

Step 1520: removing the sacrificial lines of material 1104 from the fill material to form a plurality of trenches in the fill material.

Step 1522: forming a plurality of damascene conductive lines 1302 in portions of the fill material by filling the plurality of trenches using a conductor material.

Step 1524: Stop

The above sequence of steps illustrates a method of forming a plurality of damascene conductive lines for a 3D memory device according to various embodiments of the present invention. Depending on the implementation, one or more steps may be added, one or more steps may be omitted, or one or more steps may be provided in a different sequence without departing from the scope of the present technology.

In various embodiments, the technology described includes a method to form a conductor structure for a 3D memory device.

In various embodiments, the present technology provides a 3D memory device structure. The 3D memory device structure includes a semiconductor substrate having a surface region. A plurality of memory device structure overlies the surface region of the semiconductor substrate. Each of the plurality of memory device structure includes a spaced apart stacked of semiconductors extended in a first direction and a plurality of conductor lines disposed in a trench structure perpendicular relative to the first direction. The trench structure is configured in portions of an insulator fill. The 3D memory device structure further includes a memory material conformably formed overlying each of the spaced apart stacked of conductors and a memory element at a crosspoint of each of spaced apart stacked of semiconductors and the conductor line. In various embodiments, the conductive line is formed by the steps of:

(1) forming a first patterned photosensitive material structure (for example, for word line patterning) overlying a first insulator comprising a stack of dielectric material (for example, SHB+ODL), the first patterned photosensitive material structure having a first side and a second side;

(2) depositing a third dielectric material ($1^{st}$ LTO) overlying the first patterned material structure;

(3) subjecting the third dielectric material to a patterning and etching process to form a second material structure while maintaining the first patterned material structure and exposing a surface region of the first patterned material structure, the second material structure is configured to abut the first side and the second side of the first photosensitive material structure and aligned orthogonal relative to the spaced apart stack of conductors;

(4) removing the first patterned photosensitive material structure while maintaining the second material structure;

(5) removing a portion of the first stack of dielectric material using the second material structure, for sidewall spacer) as a patterned mask to form a first opening structure and a third material structure, the third material structure comprising at least the third dielectric material and a portion of the first stack of dielectric material; and (6) depositing a fourth dielectric material as in insulator fill for a damascene feature overlying the third material structure and to fill the opening structure;

(7) forming a conductor structure comprising a plurality of conductive lies in portions of the fourth dielectric material within the damascene feature using a damascene process.

Depending on the implementation, the damascene process includes selectively removing the third dielectric material and the first stack of dielectric material to form a second opening structure in portions of the fourth dielectric material. A conductive material is deposited to fill the second opening structure and to form a thickness overlying exposed surface of the fourth dielectric material. The conductive material is subjected to a planarization process to remove the thickness of conductive material from the surface region of the fourth dielectric material to form a conductor structure comprising a plurality of damascene conductive lines in the second opening structure. The planarization process further allows for electrical and physical isolation for each of the plurality of conductive lines. In various embodiments, the conductor structure forms a plurality of word lines for the 3D memory device.

Figure 16:
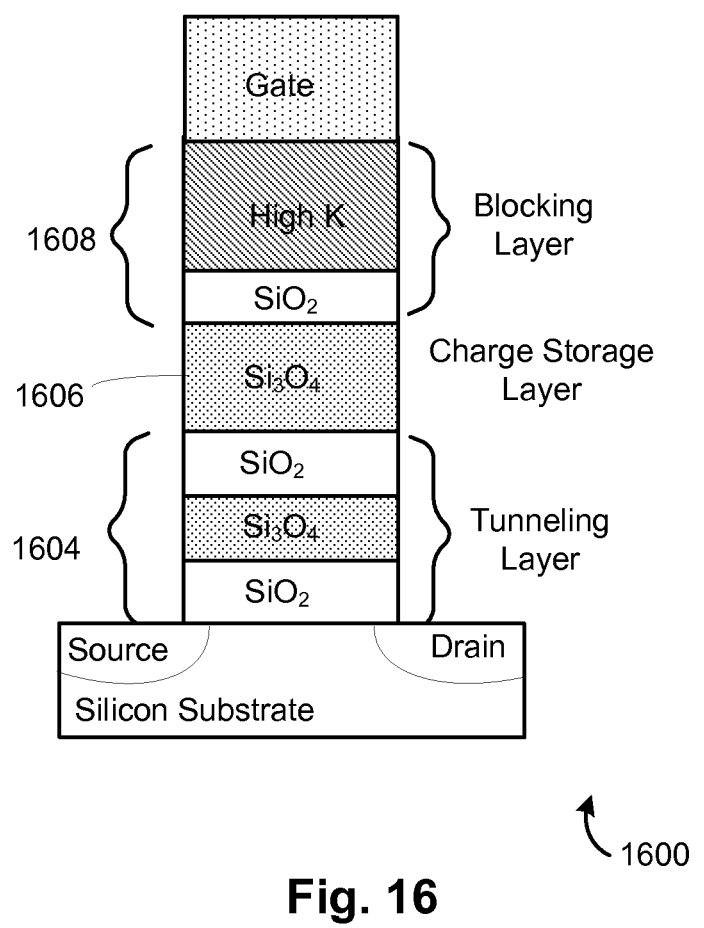
FIG. 16 is an illustration of a memory cell for a high density memory device.

Efforts have been made to improve performance of a charge trapping non-volatile memory device memory device. For certain implementation, the performance improvement can be achieved by engineering the memory material as described in the technologies of copending U.S. patent application Ser. No. 13/398,825, of which is incorporated by reference in its entirety. As shown in FIG. 16, the memory material 1600 can include a multilayer of materials of various functions overlying a semiconductor substrate. Memory material 1600 includes a tunneling layer 1604, a charge storage layer 1606, and a blocking dielectric layer 1608. The tunneling layer can be a first dielectric stack having alternating layers of silicon oxide, silicon nitride, and silicon oxide (an ONO, commonly known). The memory device can have a bandgap engineered tunneling layer that have negligible charge trapping efficiency, a relative large hole tunneling barrier at a first location, and a high electron tunneling height at a second location within the first dielectric stack. Such tunneling layer separates the material with a low hole tunneling height from the charge trapping layer. In various embodiments, charge storage layer 1606 can be a silicon nitride material or silicon oxide material depending on the implementation. As shown, blocking dielectric layer 1608 includes a high K dielectric material and a buffer material. The high K dielectric material can be aluminum oxide, hafnium oxide, or others using a high quality silicon oxide as the buffer layer. The high quality silicon oxide helps to maintain the desire blocking characteristic for the high K dielectric that has defects (for example pin holes) therein. In various embodiments, the high K dielectric blocking material reduces an electric field in the charge storage layer during erase operation allowing for a high voltage erase and a high erase speed. An erase operation usually utilizes an electron injection or hole injection from a gate (for example, word line) depending on the program operation. The erase voltage depends at least on work function of the gate material. If the gate material work function is too low, the erase voltage cannot be reduced and negatively impacts operation window of a multilevel cell. Additionally, for high density memory device, device shrink entails a scaling down of the gate (for example, word line) critical dimension, which causes an increase in resistance and reduce speed due to an RC delay. Coupling between word lines can become severe and interfere with operation (program, read, or erase)

Accordingly, an alternative method of forming a damascene conductor for a 3D memory device is provided as illustrated in various views in FIGS. 17-26, 17A-26A, 17B-26B, and 20C-26C. In various embodiments, the 3D memory device is characterized by a high speed operation (for example, an erase operation) free from word lines coupling and interference in the high density array.

The alternative method may start from the partially formed memory device 100, which includes a plurality of spaced apart stacks 106 of semiconductor strips, including semiconductors 101, sometimes referred to as semiconductor strips, and dielectrics 103, formed on a dielectric layer 104 over a substrate 102, as illustrated in various views in FIGS. 2, 2A, and 2B. A dielectric layer 108 is formed on top of stacks 106. As shown in FIGS. 17, 17A, and 17B, a memory material 1702 is formed overlying each of the plurality of spaced apart stacks 106 of semiconductor strips with dielectric layer 108. Memory material 1702 can comprise a multilayer of materials as in FIG. 16, exposing high K dielectric material. A top view diagram of partially formed memory device 100 is illustrated in FIG. 17. Cross sectional views along direction A-A crossing the ridges of the plurality of stack of semiconductor strips (for example, stack 106 illustrated in FIG. 1), and direction C-C along a ridge, are respectively shown in FIGS. 17A and 17B.

A next stage of fabrication is illustrated in FIGS. 18, 18A, and 18B. FIGS. 18, 18A, and 18B show the corresponding structures in FIGS. 17, 17A, and 17B following deposition of a cap layer 1802. As shown, cap layer 1802 is deposited conformably over exposed high K dielectric material of the memory material 1702. Cap layer 1802 can be a dielectric material, such as silicon nitride or other suitable material, and selected to protect the high K dielectric material in subsequent process steps, particularly plasma damage in a reactive ion etch process, in certain embodiments. Cap material 1802 may not be needed depending on the implementation.

The present method uses a damascene process to form the conductive lines as illustrated by ways of FIGS. 19-26, 19A-26A, 19B-26B, and 19A-26C.

Figure 19A:
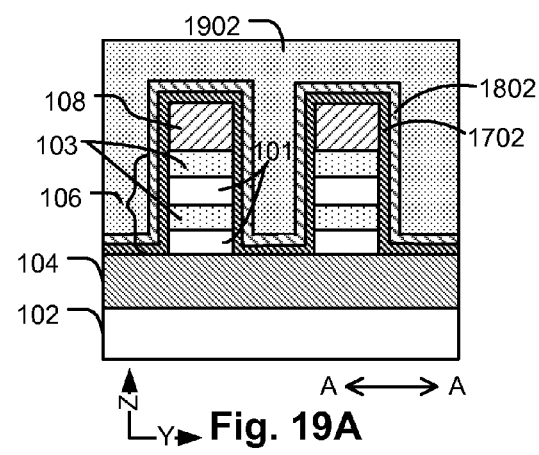
Figure 19:
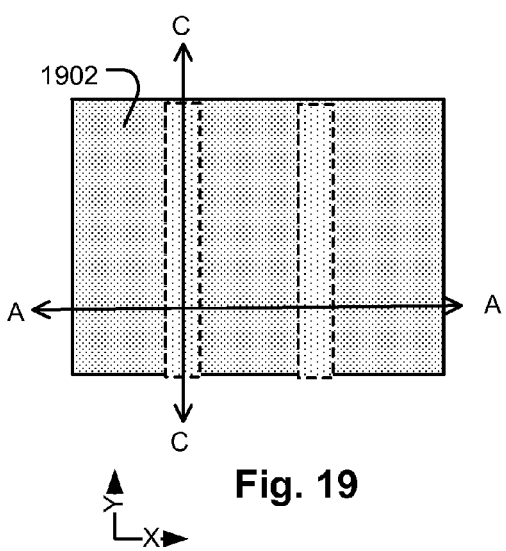
Figure 19B:
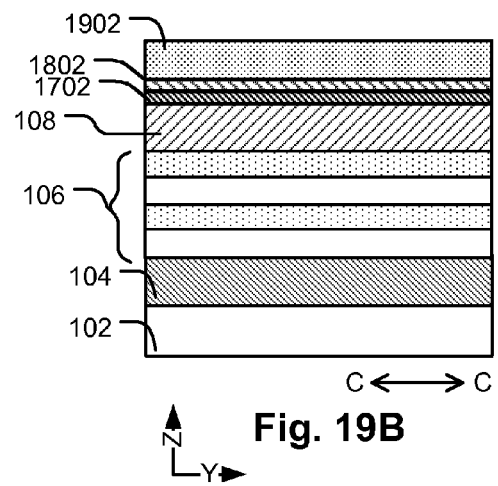

FIGS. 19, 19A, and 19B show the corresponding structures in FIGS. 18, 18A, and 18B after deposition of a fill material 1902. As shown, fill material 1902 covers cap layer 1802, and fills gaps between spaced apart stacks of semiconductor strips 106. Fill material 1902 can be an organic dielectric material, deposited using a spin on coating technique. The organic dielectric material should be thermally stable (greater than about 400 degree Celsius) for subsequent processes (for example, back end of line processes). Example of such organic dielectric material may include TOPAZ™ from Applied Material of Santa Clara, Calif., USA.

Additionally, fill material 1902 can have a substantially flat surface as deposited in various embodiments. In other implementations, fill material 1902 can have a topography and may be planarized using an etch back process or a chemical mechanical polishing process known to one skilled in the art.

Figure 20A:
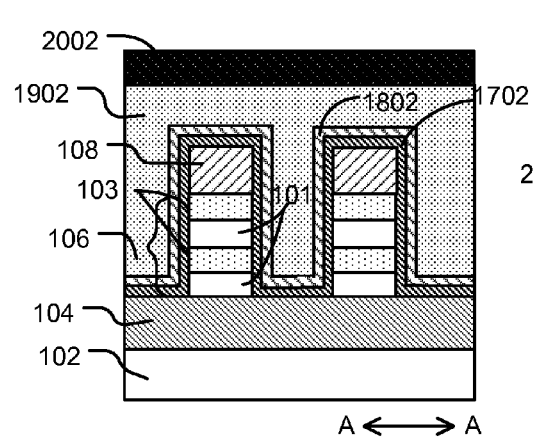
Figure 20:
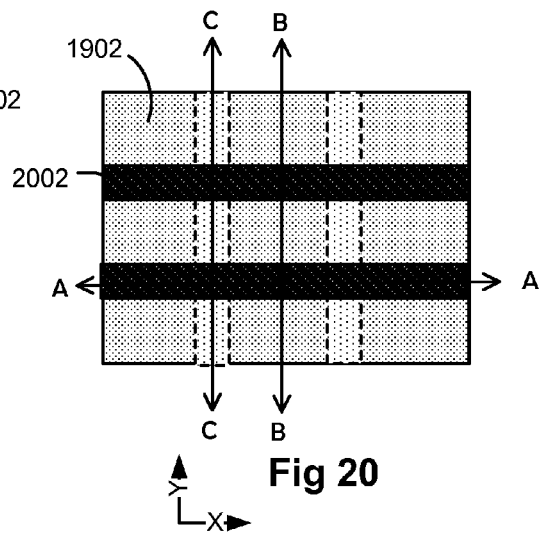
Figure 20B:
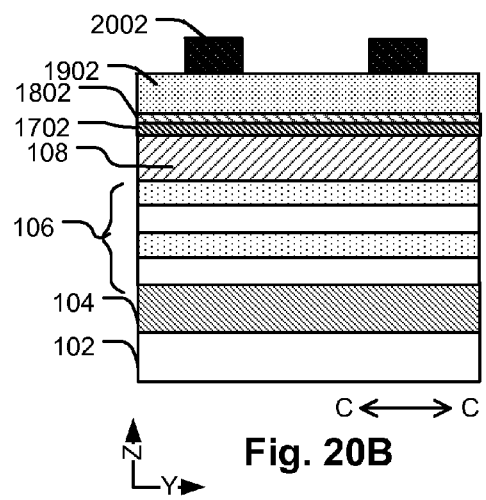
Figure 20C:
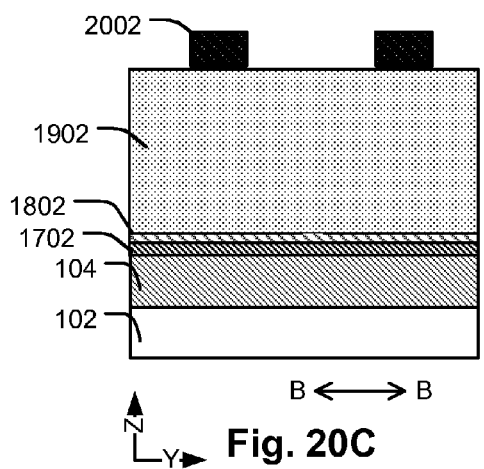
Figure 21A:
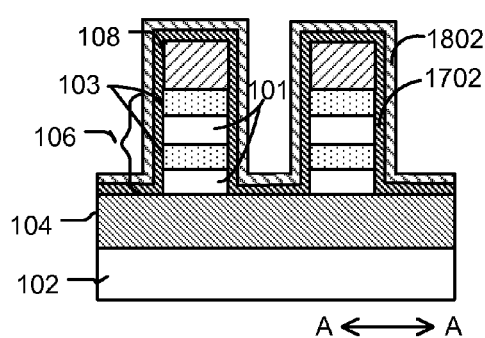
Figure 21:
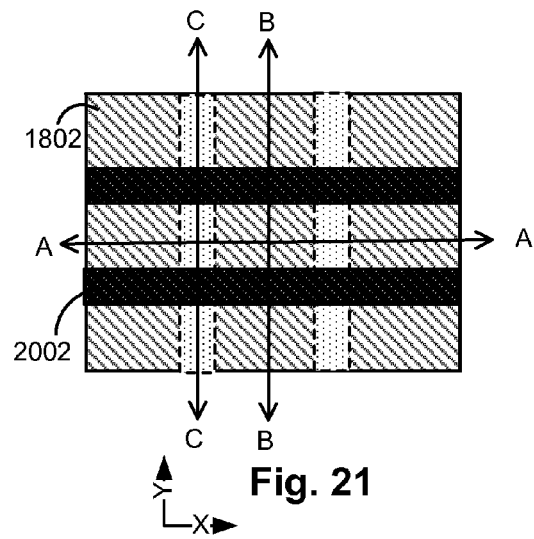
Figure 21B:
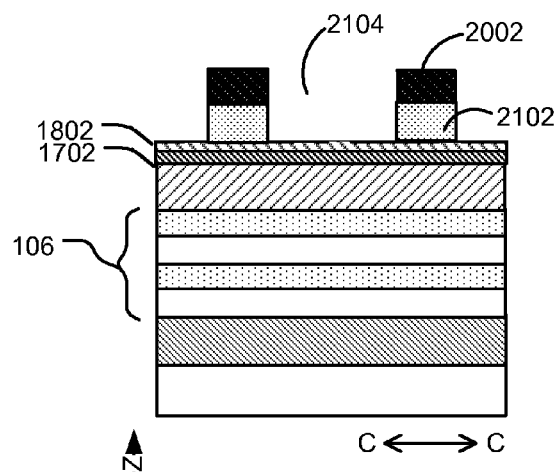
Figure 21C:
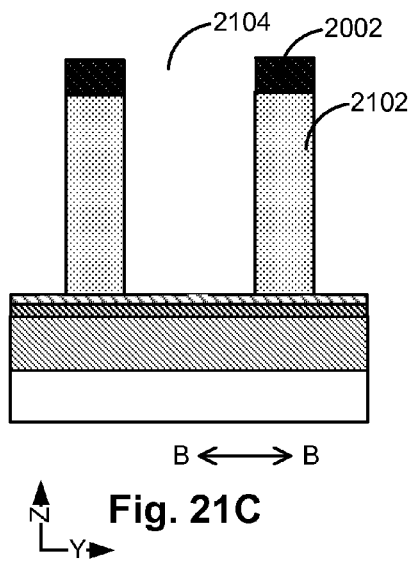
Figure 22A:
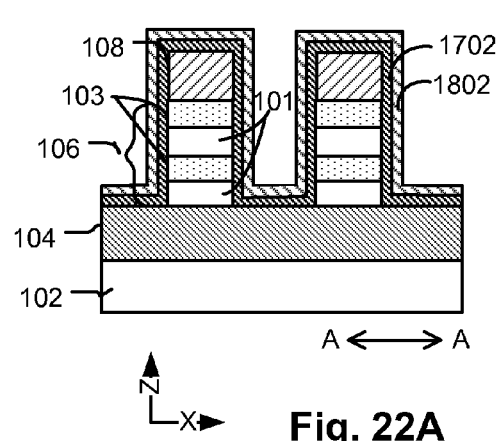
Figure 22:
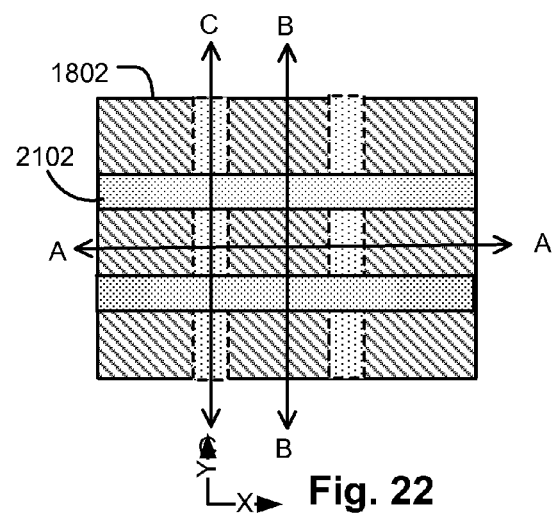
Figure 22B:
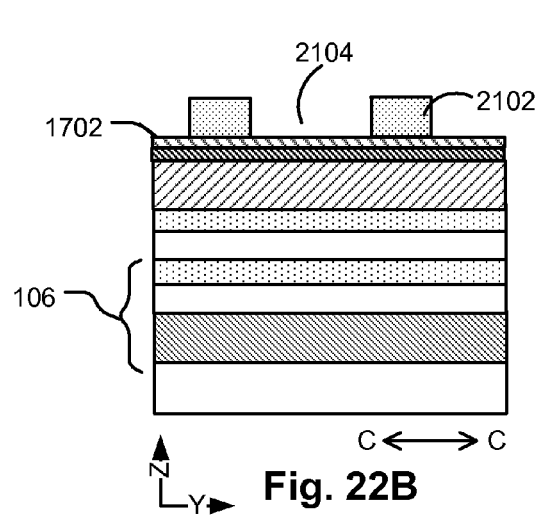
Figure 22C:
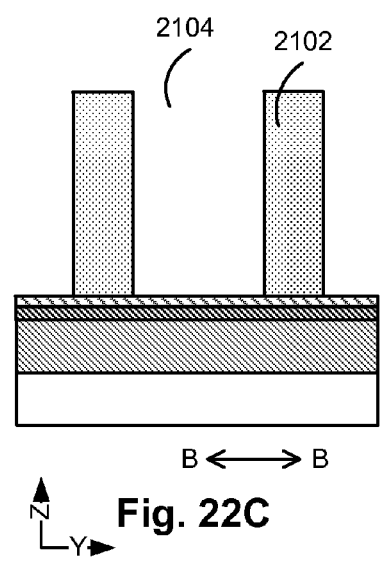
Figure 23A:
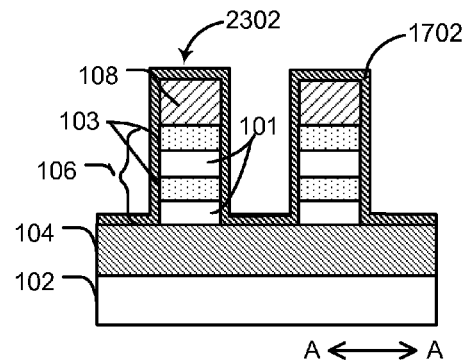
Figure 23:
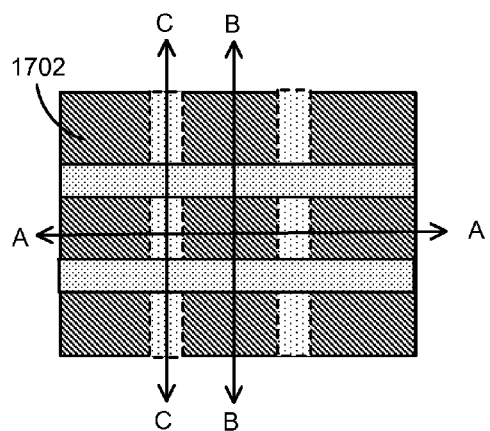
Figure 23B:
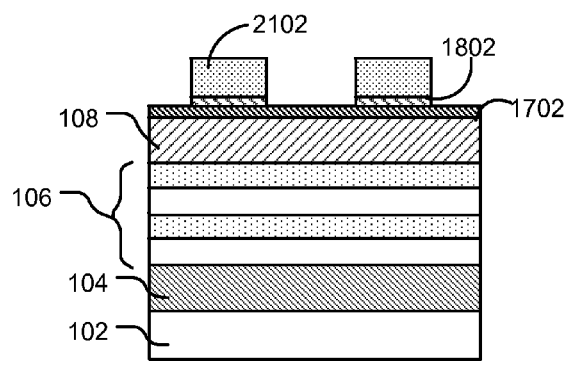
Figure 23C:
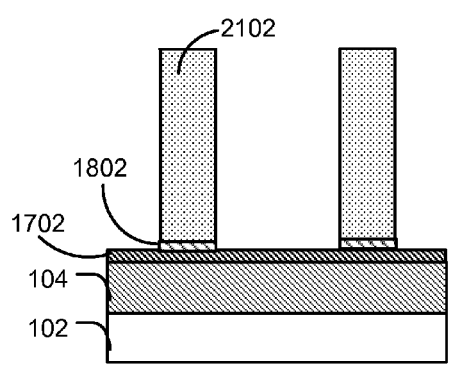
Figure 24A:
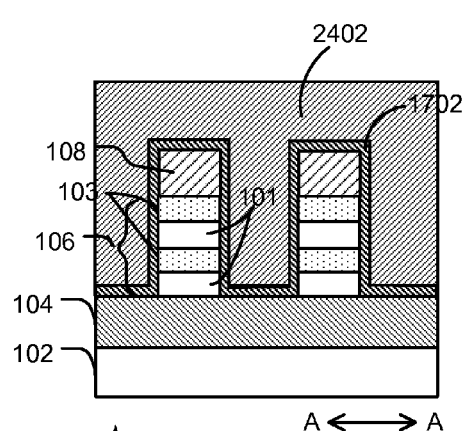
Figure 24:
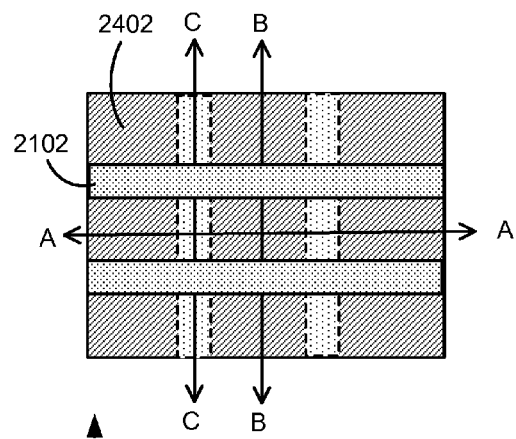
Figure 24B:
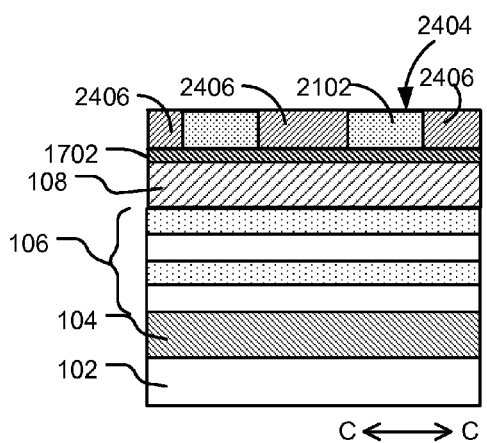
Figure 24C:
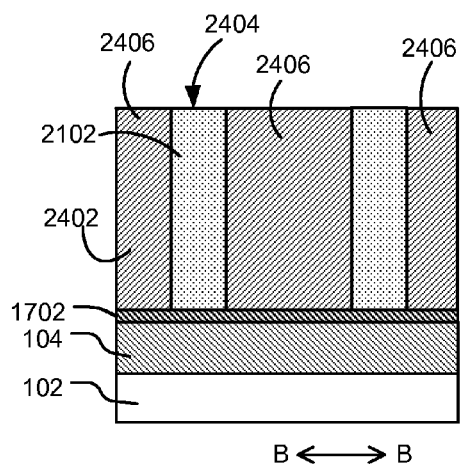
Figure 25A:
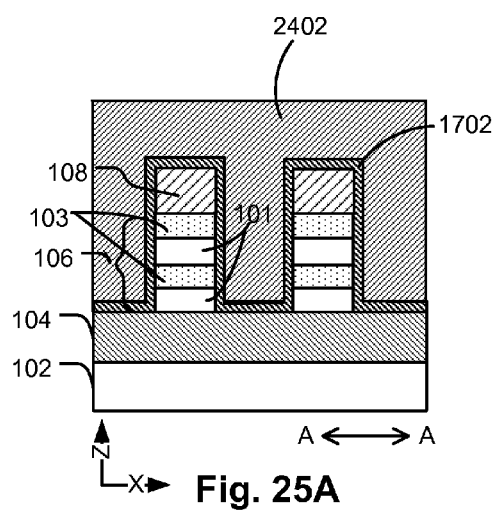
Figure 25:
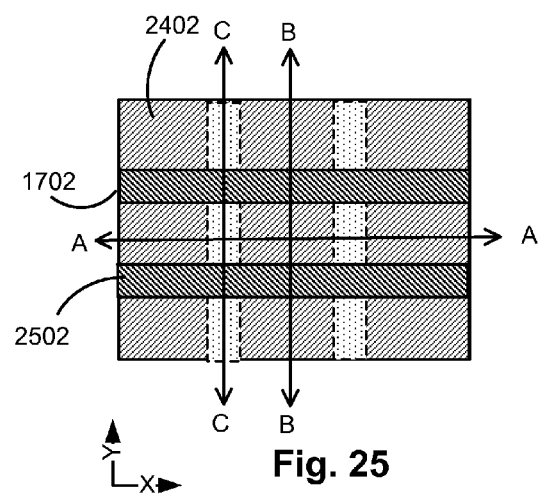
Figure 25B:
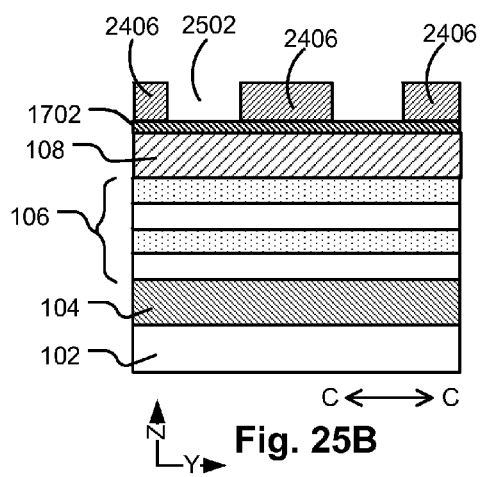
Figure 25C:
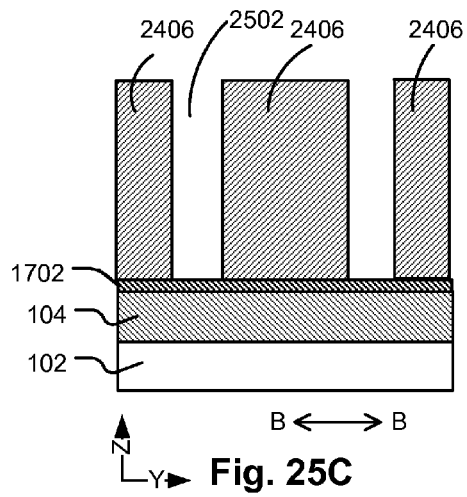

FIGS. 20, 20A, and 20B show the corresponding structures in FIGS. 19, 19A, and 19B following a formation of patterned mask 2002 over fill material 1902. A cross sectional view along direction B-B between the ridges of the plurality of stack of semiconductor strips is further illustrated in FIG. 20C. Patterned mask 2002 can be formed from a photoresist material in various embodiments. In other implementations, patterned masked may be formed from a dielectric material, a semiconductor material, a metal material, and others. In various embodiments, patterned mask 2002 is configured to align along direction A-A, orthogonal relative to the ridges of the plurality of stack of semiconductor strips and strings of memory cell along direction C-C in various embodiments.

As illustrated in various views in FIGS. 21, 21A, 21B, and 21C, the present method subjects fill material 1902 to a first etching process using patterned mask 2002 as a masking layer. The first etching process exposes a surface region of cap material 1802 to form plurality of patterned trenches 2104 in the fill material. Additionally, a plurality of sacrificial lines of material 2102 is formed from the fill material. The first etching process can be a reactive ion etch (RIE) in various embodiments. The first etching process uses cap layer 1802 as a stop material. Cap layer 1802 also protects high K dielectric material 1702 from plasma damage during the reactive ion etch process. FIGS. 21, 21A, 21B, and 21C illustrate the corresponding structure in FIGS. 20, 20A, 20B, and 20C after the first etching process.

As shown in various views in FIGS. 22, 22A, 22B, and 22C, patterned mask 2002 is removed while maintaining the plurality of sacrificial lines of material 2102 from the fill material separated by the plurality of patterned trenches 2104. Each of the plurality of patterned trenches is oriented orthogonal relative to the ridges of the plurality of stacks of semiconductor strips 106 and strings of memory cell. FIGS. 22, 22A, 22B, and 22C illustrate the corresponding structure in FIGS. 21, 21A, 21B, and 21C after the first etching process.

Referring to FIGS. 23, 23A, 22B, and 23C, various views of corresponding structure in FIGS. 22, 22A, 22B, and 22C after selected removal of cap layer 1802 are illustrated. As shown, cap layer 1802 is selectively removed to expose a high K dielectric surface 2302 of the memory material (for example high K dielectric material in blocking layer 1608 in FIG. 16). Dry etching processes may be used, for example reactive ion etching RIE using $CF_4$ or $CHF_3$, or a mixture of gas to remove the thin silicon nitride film.

In various embodiments, the present method includes depositing a conductive material 2402 to fill the plurality of patterned trenches and over high K dielectric layer 1702. Various views in FIGS. 24, 24A, 24B, and 24C, show the corresponding structure in FIGS. 23, 23A, 23B, and 23C following deposition of conductive material 2402. As shown, conductive material 2402 is further subjected to a planarization process to expose each of the plurality of sacrificial lines of material surface 2404 and to form a plurality of damascene conductive lines 2406 over and in between the plurality of spaced apart stacks of semiconductor strips 106. Conductive material 2402 can be a high work function metal or a doped polysilicon material in certain embodiments. In other embodiments, a high work function material can improve the performance of the blocking layer in the memory cell, and can lower the sheet resistivity of the damascene conductive line, which provides wider operation window, especially for erase operation for the memory device. Examples of such high work function material may include metal material, such as copper, aluminum, tungsten and other commonly used metal materials for semiconductor devices.

Referring to FIGS. 25, 25A, 25B, and 25C. Each of the plurality of sacrificial lines of material 2102 is removed to form a plurality of gaps 2502 while the maintaining the plurality of damascene conductive lines 2406 as illustrated. The plurality of gaps 2502 comprises air (which includes the ambient gases present when the gaps are closed) to provide electrical insulation between the plurality of damascene conductive lines 2406 in various embodiments. In other embodiments, the plurality of gaps may also be filled using a suitable dielectric material to provide electrical insulation between the plurality of damascene conductive lines 2406. FIGS. 25, 25A, 25B, and 25C show the corresponding structure in FIGS. 24, 24A, 24B, and 24C following removal of the plurality of sacrificial lines of material 2102.

Referring to FIGS. 26, 26A, 26B, and 26C, the present technology includes depositing a non-conformal dielectric material 2602 overlying the plurality of damascene conductive lines surface. The dielectric material is deposited non-conformably to form an air gap 2502 between plurality of damascene conductive lines 2402 in various embodiments. Air gap 2502 provides electrical insulation between damascene conductive lines 2406 in various embodiments. The implementation of air gaps as electrical insulation allows for a high speed of operation for the high density memory device free from cross interference and RC delays. FIGS. 26, 26A, 26B, and 26C show the corresponding structure in FIGS. 25, 25A, 25B, and 25C following formation of non-conformal dielectric material 2602. For purpose of illustration, top view in FIG. 26 shows features below plane 26-26 absent of dielectric material 2602.

Figure 27:
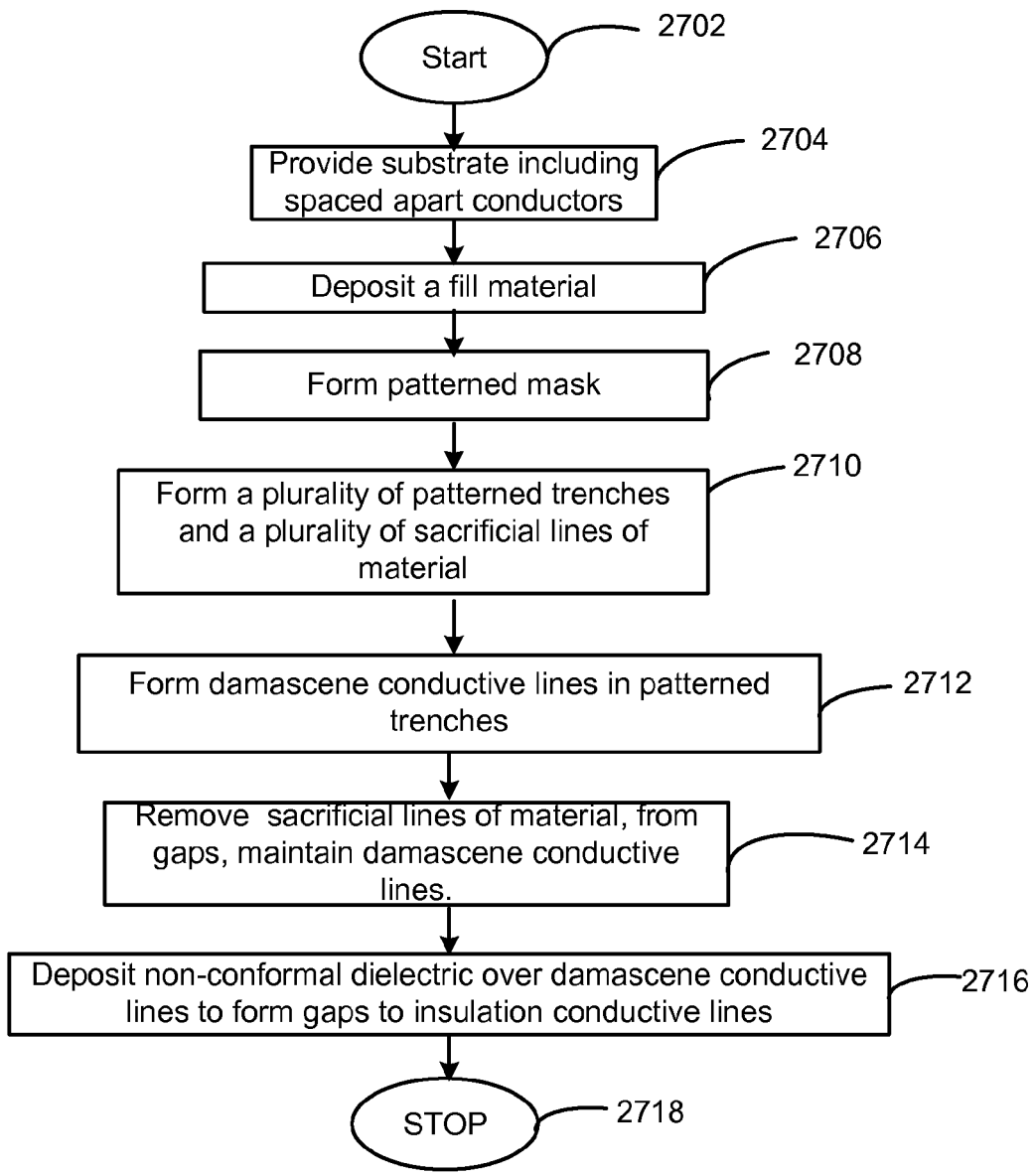
FIG. 27 illustrates a process flow for the alternative method of forming a conductor structure for a 3D memory device.

FIG. 27 illustrates a process flow diagram for the method of forming a damascene conductive line insulated by an air gap. The method includes the following steps:

Step 2702: a start step

Step 2704: providing a semiconductor substrate having a surface region, the substrate can include one or more spaced apart stacks of semiconductor strips (for example, stack 106 in FIG. 2) having a memory material over each of the spaced apart stack.

Step 2706: depositing a fill material 1902 for a damascene process overlying the one or more spaced apart stack of conductors filling a gap between the one or more spaced apart stack of conductors.

Step 2708: forming a patterned mask 2002 arranged orthogonal relative to the one or more spaced apart stack of conductors.

Step 2710: forming a plurality of patterned trenches 2104 in the fill material and a plurality of sacrificial lines of material 2102 from the fill material.

Step 2712: forming a plurality of damascene conductive lines 2406 by filling the plurality of patterned trenches using a high work function conductor material, the plurality of patterned trenches provide for a "mold" for the plurality of damascene conductive lines.

Step 2714: removing the plurality of sacrificial lines of material and maintaining the plurality of damascene conductive lines.

Step 2716: depositing a non-conformal dielectric material over the plurality of damascene conductive lines to form air gaps between the damascene conductive lines to electrically insulate the damascene conductive lines.

Step 2718: Stop

The above sequence of steps provides a method of forming a plurality of damascene conductive lines insulated by air gaps for a memory device in various embodiments. The memory device comprises high work function damascene conductive lines for a high speed of operation. By using air gaps as electrical insulator between the damascene conductive lines, interference between conductive lines and memory strings at high voltage for high speed operation (for example, a high speed erase operation) is thus minimized. The process steps and structures described with reference to FIGS. 19-26, 19A-26A, 19B-26B,19A-26C and 27, can be combined where appropriate with those of FIGS. 2-14, 2A-14A, 2B-14B, 5C-14C, 7D-14D, and 15. It is not practical to describe all the permutations of such combinations, though all reasonable permutations are contemplated. For one example, the double patterning process can be used with high work function conductor materials.

Referring again to various views in FIGS. 24, 24A, 24B, and 24C. Depending on the implementation, dielectric material 1902 can be an electrical insulation material for damascene conductive lines 2406. That is, sacrificial lines of material 2404 is maintained to provide for insulation between damascene conductive lines 2406. For such implementation, dielectric material may be silicon oxide, silicon nitride, a low K dielectric, a high K dielectric, and a combination of these, and others.

In various embodiments, the present technology provides a 3D memory device structure. The 3D memory device structure includes a semiconductor substrate having a surface region. A plurality of memory device structure overlies the surface region of the semiconductor substrate. Each of the plurality of memory device structure includes a spaced apart stacked of conductors extended in a first direction and a plurality of conductor lines perpendicular relative to the first direction. The 3D memory device structure further includes a memory material conformably formed overlying each of the spaced apart stacked of conductors and a memory element at a crosspoint of each of spaced apart stacked of conductors and the conductor line. In various embodiments, the conductor line comprises a metal material insulated using an air gap and can be fabricated using the following steps:

(1) forming a memory material 1702 comprising a tunneling layer, a charge storage material, and a blocking layer conformably overlying a plurality of spaced apart semiconductor structures (for example, stack 106 in FIG. 2);

(2) depositing a protective cap dielectric layer 1802 overlying the memory material;

(3) depositing a fill material 1902 for a damascene process covering the protective cap dielectric layer;

(4) forming a patterned mask 2002 over the fill material;

(5) subjecting the fill material to an etching process to form a plurality of trench openings 2104 as molds for the damascene process in the fill material and a plurality of sacrificial lines of material 2102 from the fill material using the patterned mask as a making layer;

(6) filling the plurality of trench opening using a conductive material 2402 to form a plurality of damascene conductive lines 2406;

(7) removing the sacrificial lines of material to form a gap 2502 between damascene conductive lines 2406; and (8) depositing a non-conformal dielectric material 2602 over damascene conductive lines 2406 and form an air gap 2502 between damascene conductive lines 2406 and non-conformal dielectric material 2602.

The above sequence of steps provides a method for forming a plurality of conductive lines insulated using air gaps. Other variations and modifications can exist. For example, gap 2502 can be filled using a suitable insulator material to electrically insulate conductor lines, and others. Such insulator material can include silicon oxide, silicon nitride, high K dielectric, low K dielectric, including a combination, and others.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A method of forming a conductor structure for a device, comprising:
    providing a substrate having a plurality of spaced apart stacks of semiconductor strips;
    forming a fill material having a plurality of patterned trenches between and over the plurality of spaced apart stacks; and
    filling the plurality of patterned trenches with a conductor material to form conductive lines overlying the plurality of spaced apart stacks of semiconductor strips disposed orthogonally relative to the spaced apart stacks of semiconductor strips,
    wherein semiconductor strips in the plurality of spaced apart stacks include channel regions of memory cell strings,
    wherein said forming a fill material having a plurality of patterned trenches comprises:
    covering the plurality of spaced apart stacks of semiconductor strips with a first insulator, the first insulator having a first thickness over the plurality of spaced apart stacks of semiconductor strips;
    forming a patterned mask over the first insulator, the patterned mask being arranged orthogonally relative to the spaced apart stacks of semiconductor strips;
    etching the first insulator using the patterned mask to form patterned ridges of the first insulator between and over the spaced apart stacks of semiconductor strips;
    covering the patterned ridges and spaced apart stacks of semiconductor strips with a second insulator, and etching the second insulator to expose top surfaces of the patterned ridge; and
    removing the patterned ridges, leaving said fill material having said plurality of patterned trenches.

2. The method of claim 1, wherein said forming a fill material includes using double patterning to form sacrificial lines of material between, and over the plurality of spaced apart stacks, applying the fill material, and then removing the sacrificial lines of material to leave said plurality of patterned trenches in the fill material.

3. The method of claim 2, wherein said double patterning includes forming a first patterned mask, then forming sidewall spacers on the first patterned mask, and removing the first patterned mask to leave the sidewall spacers, and using the sidewall spacers as etch masks for formation of the sacrificial lines of material.

4. The method of claim 1, wherein said forming the conductive line further comprises:
    covering the fill material with the conductive material and filling the plurality of patterned trenches with the conductive material; and
    removing the conductive material from a fill material surface and leaving the conductive material in each of the plurality of patterned trenches to form the conductive lines.

5. The method of claim 1, wherein the first insulator comprises a stack of second dielectric material overlying a first dielectric material, wherein the first dielectric material comprises an organic dielectric material and the second dielectric material comprises a silicon containing bottom antireflecting coating material.

6. The method of claim 1, including providing memory elements at crosspoints of the semiconductor strips in the plurality of spaced apart stacks and the conductive lines.

7. The method of claim 1, wherein said forming the patterned mask, comprises:
    forming a first patterned photosensitive material structure overlying the first insulator aligned orthogonally relative to the spaced apart stacks of semiconductor strips, the first patterned photosensitive material structure having a first side and a second side;
    depositing a third dielectric material overlying the first patterned photosensitive material structure;
    subjecting the third dielectric material to an etching process to form the patterned mask while maintaining the first patterned photosensitive material structure and exposing a surface region of the first patterned photosensitive material structure, the patterned mask being configured to abut respectively the first side and the second side of the first photosensitive material structure; and
    removing the first patterned photosensitive material structure while maintaining the patterned mask.

8. The method of claim 1, further comprises:
    removing a portion of the first insulator using the patterned mask as a masking layer to form a first opening structure and a second material structure, the second material structure comprising at least the first insulator;
    depositing the insulator fill overlying the second material structure and filling the first opening structure, the insulator fill forming a thickness overlying the second material structure; and
    forming the conductive lines using a damascene process between, and over the plurality of spaced apart stacks.

9. The method of claim 8, wherein the damascene process comprises the steps of:
    subjecting the fill material to an etching process to expose a surface of the first insulator;
    selectively removing the first insulator from the second material structure to form the plurality of trench structures in a portion of the fill material, the second opening structure comprises a first opening and a second opening previously occupied by the second material structure;
    filling the plurality of patterned trenches with the conductor material; and
    subjecting the conductive material to a planarization process to form the conductive lines in each of the plurality of patterned trenches and to electrically and physically isolate each of the conductive lines.

10. The method of claim 9, wherein the planarization process uses the fill material as a stop material.

11. The method of claim 7, wherein subjecting the third dielectric material to a patterning and etching process comprises a directional etching process.

12. The method of claim 7, wherein the patterned mask is characterized by a sidewall spacer structure to the first patterned photosensitive material structure.

13. The method of claim 1, wherein the conductive lines form a plurality of word lines.

* * * * *